US012575400B2

(12) United States Patent
Lanzillo et al.

(10) Patent No.: US 12,575,400 B2
(45) Date of Patent: Mar. 10, 2026

(54) POWER PLANES AND PASS-THROUGH VIAS

(71) Applicant: International Business Machines Corporation, Armonk, NY (US)

(72) Inventors: Nicholas Anthony Lanzillo, Wynantskill, NY (US); Ruilong Xie, Niskayuna, NY (US); Huai Huang, Clifton Park, NY (US); Hosadurga Shobha, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 766 days.

(21) Appl. No.: 17/808,116

(22) Filed: Jun. 22, 2022

(65) Prior Publication Data

US 2023/0420366 A1     Dec. 28, 2023

(51) Int. Cl.
| | |
|---|---|
| *H01L 29/66* | (2006.01) |
| *H01L 21/768* | (2006.01) |
| *H01L 21/8234* | (2006.01) |
| *H01L 23/522* | (2006.01) |
| *H01L 23/528* | (2006.01) |

(52) U.S. Cl.
CPC .... *H01L 23/5286* (2013.01); *H01L 21/76805* (2013.01); *H01L 21/76831* (2013.01); *H01L 23/5226* (2013.01)

(58) Field of Classification Search
CPC .............. H01L 23/5222–5226; H01L 23/5286
See application file for complete search history.

(56) References Cited

U.S. PATENT DOCUMENTS

| | | | |
|---|---|---|---|
| 7,272,803 B1 | 9/2007 | Hsu | |
| 8,455,924 B2 * | 6/2013 | Greenberg | H01L 23/528 |
| | | | 257/E27.081 |
| 9,887,133 B2 | 2/2018 | Chi | |
| 10,020,254 B1 | 7/2018 | Bao | |
| 10,026,687 B1 | 7/2018 | Lin | |
| 10,283,407 B2 | 5/2019 | Chi | |
| 10,553,789 B1 | 2/2020 | Lanzillo | |
| 10,886,224 B2 | 1/2021 | Gerousis | |
| 10,950,550 B2 | 3/2021 | Qian | |
| 11,055,469 B2 | 7/2021 | Peng | |

(Continued)

OTHER PUBLICATIONS

Chen et al., "Design and Optimization of SRAM Macro and Logic Using Backside Interconnects at 2nm node", 2021 International Electron Devices Meeting (IEDM), © 2021 IEEE, 4 pages.

*Primary Examiner* — Victoria K. Hall
(74) *Attorney, Agent, or Firm* — Samuel A. Waldbaum

(57) ABSTRACT

The semiconductor device includes a first metal layer, a second metal layer, a metal plane, a third dielectric layer and a fourth dielectric layer. The first metal layer comprises a first dielectric layer with a first plurality of signal track and a first plurality of power rails. The second metal layer comprises a second dielectric layer with a second plurality of signal tracks and a second plurality of power rails. The metal plane is between the first metal layer and the second metal layer. The third dielectric layer is between the first metal layer and the metal plane. The fourth dielectric layer is between the second metal layer and the metal plane.

12 Claims, 19 Drawing Sheets

(56)        References Cited

U.S. PATENT DOCUMENTS

| | | | |
|---|---|---|---|
| 2004/0099939 A1* | 5/2004 | Alcoe | H01L 23/49827 |
| | | | 438/106 |
| 2004/0145855 A1* | 7/2004 | Block | H01L 23/5223 |
| | | | 257/E21.018 |
| 2005/0042867 A1* | 2/2005 | Sanchez | H01L 21/76898 |
| | | | 257/E21.597 |
| 2005/0099783 A1* | 5/2005 | Alcoe | H01L 24/17 |
| | | | 361/748 |
| 2009/0115047 A1 | 5/2009 | Haba | |
| 2015/0364405 A1* | 12/2015 | Kunimoto | H05K 3/0047 |
| | | | 174/251 |
| 2017/0263470 A1 | 9/2017 | Lin | |
| 2019/0096798 A1* | 3/2019 | Aleksov | H01L 23/5225 |
| 2019/0139889 A1* | 5/2019 | Ding | H10D 1/20 |
| 2020/0211955 A1* | 7/2020 | Rubin | H01L 23/66 |

* cited by examiner

POWER PLANES AND PASS-THROUGH VIAS

BACKGROUND

The present invention relates generally to the field of semiconductor devices, and more particularly to power planes and pass-through vias for improved power delivery in semiconductor devices.

In fabricating semiconductor devices, millions of devices can be located together on a single substrate. Useful control of these millions of devices relies on the application of electrical signals to specific devices while insulating the electrical signals from shorting to anything else (e.g., other devices). Within standard logic cells, power rails in back-end of line (BEOL) metal layers deliver current to source/drains that power the individual devices (e.g., transistors). The power rails carry a higher current than standard routing tracks/signal lines to maintain adequate power distribution targets, and therefore require a larger space in the cell. In many designs, a power rail can be four times larger than a normal routing line, which can limit scaling for integrated circuits. As integrated circuits get denser and denser, the power delivery network can become a bottleneck in the circuit design. Power delivery networks are becoming highly resistive, contributing to increased IR loss, while a higher number of transistors and faster clock speeds are contributing to increased inductance loss.

SUMMARY

Embodiments of the present invention provide for a semiconductor device. In an embodiment, the semiconductor device includes a first metal layer, a second metal layer, a metal plane, a third dielectric layer and a fourth dielectric layer. The first metal layer comprises a first dielectric layer with a first plurality of signal track and a first plurality of power rails. The second metal layer comprises a second dielectric layer with a second plurality of signal tracks and a second plurality of power rails. The metal plane is between the first metal layer and the second metal layer. The third dielectric layer is between the first metal layer and the metal plane. The fourth dielectric layer is between the second metal layer and the metal plane.

In an embodiment, the semiconductor device includes a metal plane, one or more second metal level, and one or more via. The metal plane is above one or more first metal level. The one or more second metal is above the metal plane. The one or more via connect any of the one or more first metal level to any of the one or more second metal level through the metal plane.

In an embodiment, the semiconductor device includes a first metal plane, a second metal plane and one or more metal layers. The second metal plane is above the first metal plane. The one or more metal layers are between the first metal plane and the second metal plane. The one or more metal layers include a dielectric layer with a plurality of metal interconnect wiring within the dielectric layer.

DETAILED DESCRIPTION

Figures 1, 2:
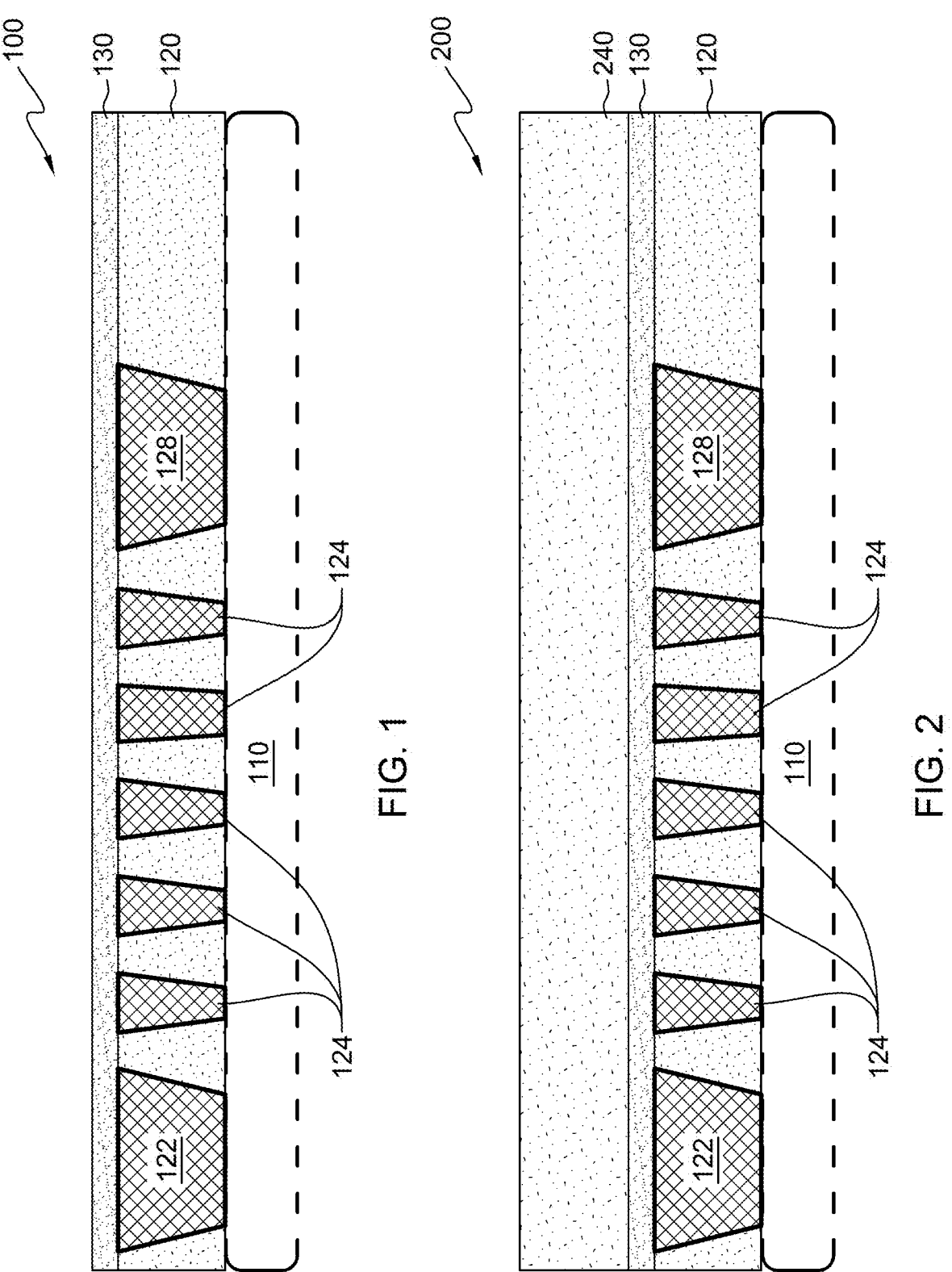
FIG. 1 is a cross-sectional view of a semiconductor device, generally designated 100, in accordance with a first embodiment of the invention.
FIG. 2 is a cross-sectional view of a semiconductor device, generally designated 200, in accordance with a first embodiment of the invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Embodiments of the present invention recognize that reducing a lateral dimension of the power rails and extending a vertical dimension deeper into the cell can keep the total metal volume in the power rail high while making room for other components. Increasing the depth of the power rail, however, can cause higher via resistance, or can cause the signal lines to carry increased capacitance between tracks in the BEOL. Burying the power rails underneath a physical device (e.g. transistor) enables the depth of the power rail to be increased independent of the signal lines in the BEOL. Buried power rails (BPR) provide significantly lower resistance through the power rail without driving any negative impact to either via resistance or capacitance in the BEOL.

Embodiments disclosed herein may also include power planes to deliver power to the transistor devices in an integrated circuit. The power planes may be stacked, with certain embodiments including a dielectric plane between power planes. The power planes may also include pass through vias to connect a higher plane (i.e., away from the transistor devices) to buried power rails of the transistor devices or to lower planes. Embodiments of the present invention provide power planes that extend over a plurality of power rails and/or signal tracks in metal layers above and/or below the power planes.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural references unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which transistor devices are fabricated.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Deposition processes as used herein include but are not limited to chemical vapor deposition (CVD), plasma-enhanced chemical vapor deposition (PECVD), atomic layer deposition (ALD), ionized plasma vapor deposition (iPVD), plasma vapor deposition (PVD), gas cluster ion beam (GCIB) deposition, electroplating, but may not be limited these known semiconductor deposition processes.

Removing or etching as used herein may or may not include patterning using one of lithography, photolithography, an extreme ultraviolet (EUV) lithography process, or other known semiconductor patterning process that is followed by one or more of the etching processes. Various materials are referred to herein as being removed or "etched" where etching generally refers to one or more processes implementing the removal of one or more materials. In some cases, the removal of a material in an area occurs while leaving other protected areas of materials unaffected that are masked during the lithography processes. Some examples of etching processes include but are not limited to the following processes, such as a dry etching process using a reactive ion etch (RIE) or ion beam etch (IBE), a wet chemical etch process, or a combination of these etching processes. A dry etch may be performed using plasma. Plasma systems can operate in several modes by adjusting the parameters of the plasma. Ion milling, sputter etching, or reactive ion etching (RIE) bombards the wafer with energetic ions of noble gases that approach the wafer approximately from one direction, and therefore, these processes are anisotropic or a directional etching processes. Chemical mechanical planarization (CMP) is another known process of removing material using a combination of abrasive (polishing using an abrasive substance) and chemical processes to remove material from a top surface of a substrate.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so many of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout. It should be noted, a low-k dielectric material is referenced throughout. In an embodiment, a low-k dielectric material is any material having a dielectric constant of less than silicon dioxide, i.e., less than about 4.0.

Referring now to various embodiments of the invention in more detail, FIGS. 1-8 are a view of a semiconductor device, in accordance with a first embodiment of the invention. FIGS. 1-8 provide only an illustration of one implementation and do not imply any limitation with regard to the environments in which different embodiments may be implemented. Many modifications to the depicted environment may be made by those skilled in the art without departing from the scope of the invention as recited by the claims.

FIG. 1 is a cross-sectional view of a semiconductor device, generally designated 100, in accordance with a first embodiment of the invention. In a first embodiment, a first interlayer dielectric (ILD) 120 is deposited upon device region 110. In an embodiment, first ILD 120 may be a low-k dielectric material, such as but not limited to a $SiO_2$ based material or any other low-k dielectric material. In an embodiment, first ILD 120 may have a sufficiently high elastic modulus, particularly at tight-pitch, so that patterning of interconnects, especially very small interconnects, is feasible.

In an embodiment, device region 110 may consist of any number of levels or layers of semiconductor devices, including but not limited to standard cells, logic gates, transistors, etc. Device region 110 is connected to elements above device region 110 through processes known in the art. In an embodiment, any number of metal layers (not shown) may exist between device region 110 and elements (e.g., 120, 122, 124, 128) on top of device region 110. In an embodiment, device region 110 may be electrically connected to elements (e.g., 120, 122, 124, 128) on top of device region 110. Device region 110 extends in a direction perpendicular to the cross-sectional area shown in FIG. 1, to form a three dimensional area of devices.

In an embodiment, first ILD 120 is etched, using conventional lithographic and etching process known in the art, to form any number of trenches that will eventually form first power rail 122, second power rail 128 and signal tracks 124. It should be noted, first power rail 122, second power rail 128, and signal tracks 124 extend perpendicularly to the cross-sectional area shown in FIG. 1, to provide power and signal routing to the device region 110.

In an embodiment, a metal layer is deposited within the trenches, discussed above, to form first power rail 122, second power rail 128, and signal tracks 124. In an embodiment, first power rail 122 provides a voltage source (e.g. $V_{DD}$ or $V_{SS}$) to parts of the device region 110. In an embodiment, second power rail 128 provides a voltage source (e.g. $V_{DD}$ or $V_{SS}$) to parts of the device region 110. In an embodiment, signal tracks 124 provide signal wiring to parts of the device region 110. In an embodiment, semiconductor device 100 may include any number of first power rail 122, second power rail 128, and signal tracks 124. In an embodiment, conventional polishing or planarization processes may be used so first power rail 122, second power rail 128, signal tracks 124 and first ILD 120 have a substantially similar height.

In an embodiment, first dielectric capping layer 130 is deposited on first power rail 122, second power rail 128, signal tracks 124 and first ILD 120. In an embodiment, first dielectric capping layer 130 may have a higher dielectric constant than first ILD 120. In an embodiment, first dielectric capping layer 130 may be dense enough to act as a hermetic seal between layers above/below the first dielectric capping layer 130. In an embodiment, first dielectric capping layer 130 may be, but is not limited to, Sin, AlN, AlO, etc.

FIG. 2 is a cross-sectional view of a semiconductor device, generally designated 200, in accordance with a first embodiment of the invention. In an embodiment, a second ILD 240 is deposited upon first dielectric capping layer 130. In an embodiment, second ILD 240 may be a low-k dielectric material, such as but not limited to a $SiO_2$ based material or any other low-k dielectric material. In an embodiment, second ILD 240 may have a sufficiently high elastic modulus, particularly at tight-pitch, so that patterning of interconnects, especially very small interconnects, is feasible. In an embodiment, second ILD 240 is substantially similar to first ILD 120. In an embodiment, after deposition of second ILD 240 a planarization and/or polishing step may occur, such as but not limited to CMP.

Figures 3, 4:
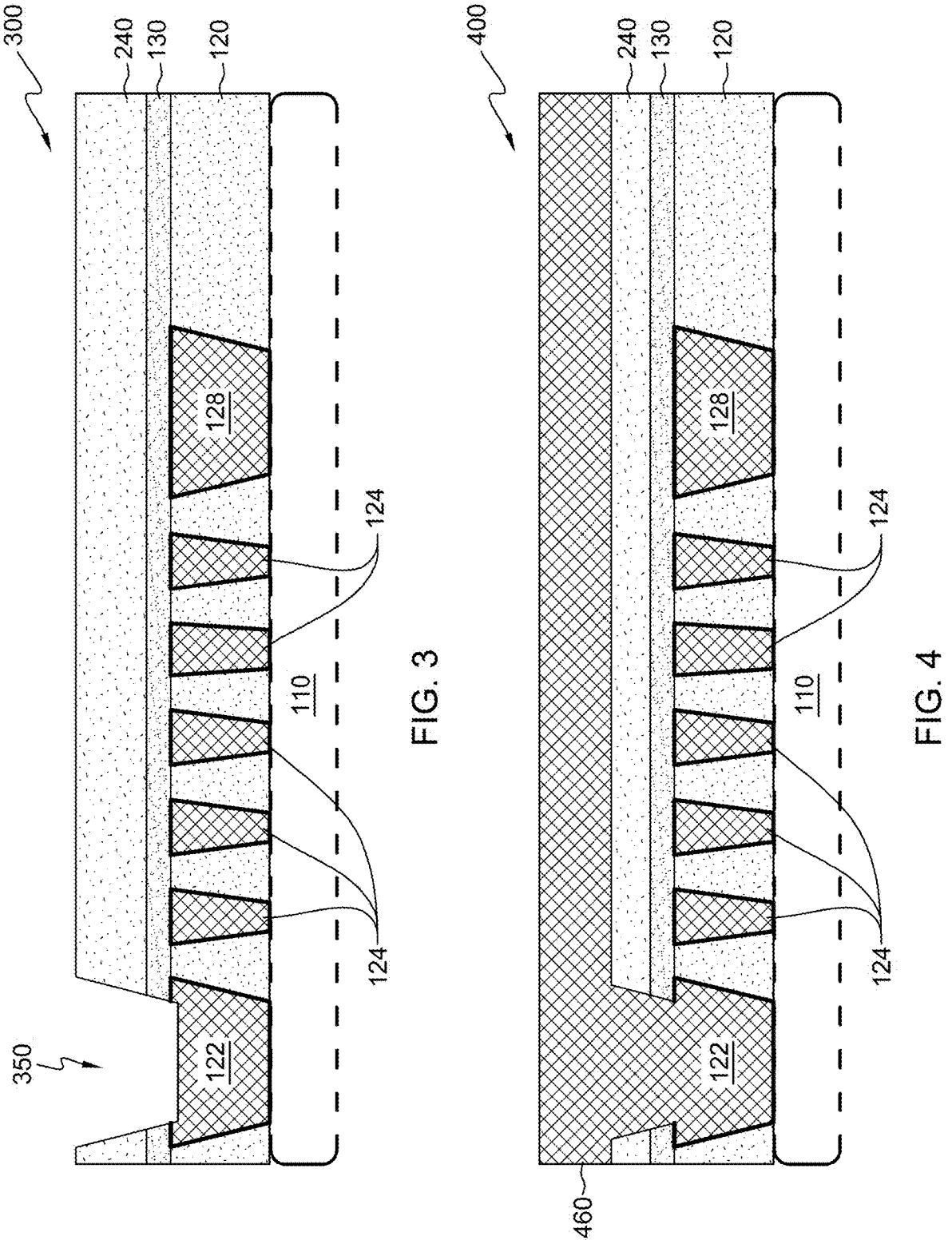
FIG. 3 is a cross-sectional view of a semiconductor device, generally designated 300, in accordance with a first embodiment of the invention.
FIG. 4 is a cross-sectional view of a semiconductor device, generally designated 400, in accordance with a first embodiment of the invention.

FIG. 3 is a cross-sectional view of a semiconductor device, generally designated 300, in accordance with a first embodiment of the invention. In an embodiment, first hole 350 is etched within second ILD 240 and first dielectric capping layer 130 using processes known in the art. In an embodiment, first hole 350, discussed below, will become a via between a power plane (not shown) and first power rail 122. In an embodiment, there may be any number of first hole 350 etched within second ILD 240 and first dielectric capping layer 130. In other words, any number of via may eventually electrically connect the power plane (not shown) and first power rail 122. In an embodiment, first hole 350 may be circular, as discussed below in FIGS. 7 and 8, square, triangular, oval, or any other shape known in the art. In an embodiment, the width of the first hole 350 closest to first power rail 122 is smaller than the width of first power rail 122.

FIG. 4 is a cross-sectional view of a semiconductor device, generally designated 400, in accordance with a first embodiment of the invention. In an embodiment, power plane 460 is deposited on top of second ILD 240 and within first hole 350. In an embodiment, power plane 460 extends in a direction perpendicular to the cross-sectional area shown in FIG. 4, to form a three dimensional power plane 460 on top of second ILD 240. In an embodiment, the three dimensional shape of the power plane 460 may be square, rectangular, triangular, circular, an irregular shape, or any combination in shape in the direction that is perpendicular to the cross-sectional area shown in FIG. 4. In an embodiment, the power plane 460 that is deposited within first hole 350 forms a via between the horizontal power plane 460 that is formed on top of second ILD 240. In an embodiment, power plane 460 is electrically connected to the first power rail 122 using the via discussed above. As discussed above, there may be any number of via in any orientation or pattern connecting power plane 460 and first power rail 122. In an embodiment, after deposition of power plane 460 a planarization and/or polishing step may occur, such as but not limited to CMP. In an embodiment, power plane 460 and first power rail 122 may be the same material. In an alternative embodiment, power plane 460 and first power rail 122 may be a different material. In an embodiment, power plane 460 may be a metal, including but not limited to, TiN, TaN, W, Ru, Co, etc.

Figure 5:
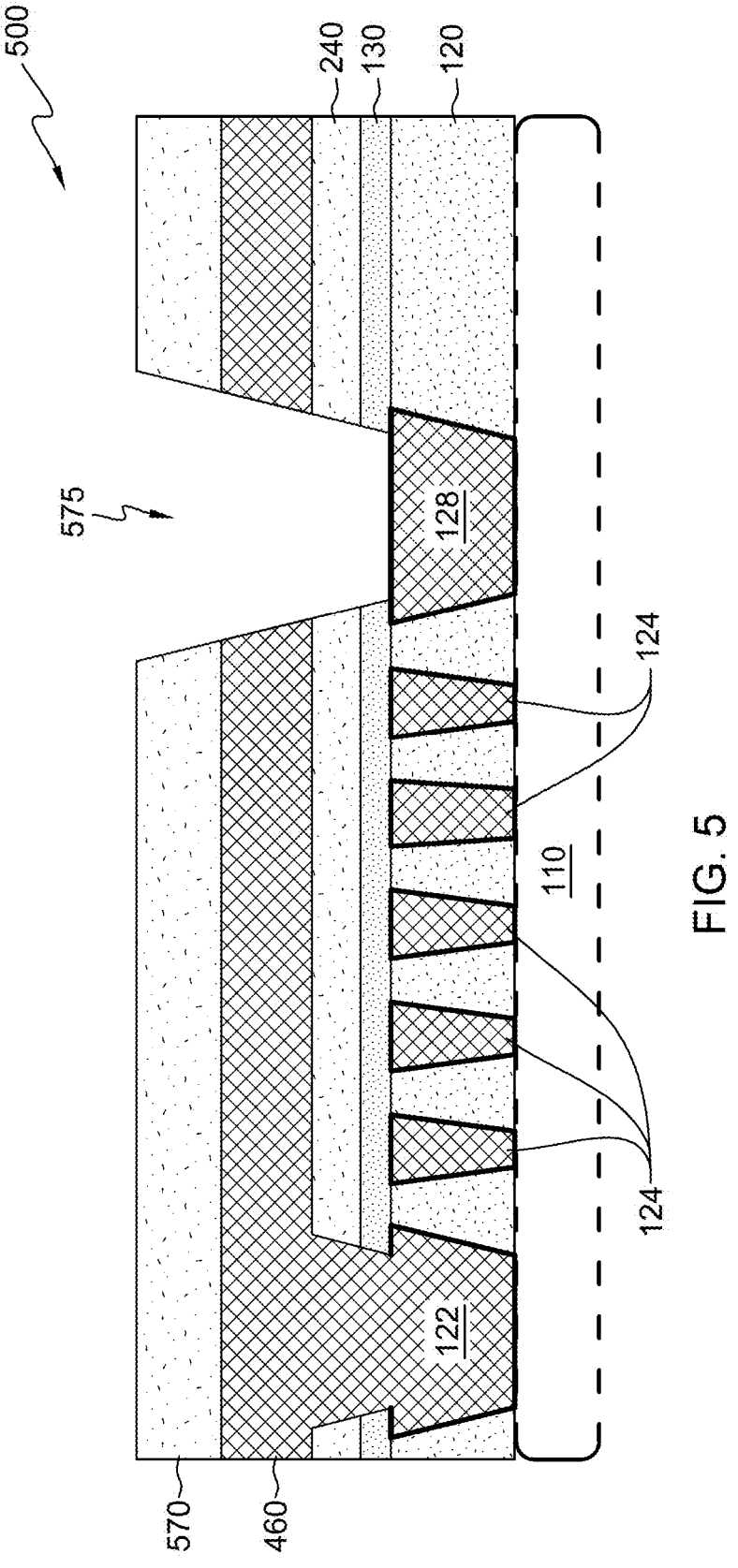
FIG. 5 is a cross-sectional view of a semiconductor device, generally designated 500, in accordance with a first embodiment of the invention.

FIG. 5 is a cross-sectional view of a semiconductor device, generally designated 500, in accordance with a first embodiment of the invention. In an embodiment, third ILD 570 is deposited on top of power plane 460. In an embodiment, third ILD 570 may be a low-k dielectric material, such as but not limited to a $SiO_2$ based material or any other low-k dielectric material. In an embodiment, third ILD 570 may have a sufficiently high elastic modulus, particularly at tight-pitch, so that patterning of interconnects, especially very small interconnects, is feasible. In an embodiment, third ILD 570 is substantially similar to first ILD 120 and/or second ILD 240. In an embodiment, after deposition of third ILD 570 a planarization and/or polishing step may occur, such as but not limited to CMP.

In an embodiment, the third ILD 570, power plane 460, second ILD 240 and dielectric capping layer 130 are etched to form second hole 575 that exposes portions of second power rail 128. In an embodiment, second hole 575 may be substantially similar to first hole 350. In other words, second hole 575 will become a via between a power plane (not shown) or other metal layer interconnect and second power rail 128. In an embodiment, there may be any number of second hole 575 etched within the third ILD 570, power plane 460, second ILD 240 and dielectric capping layer 130. In other words, any number of via may electrically connect a power plane (not shown) or other metal layer interconnect above the second power rail 128 and the second power rail 128. In an embodiment, second hole 575 may be circular, as discussed below in FIGS. 7 and 8, square, triangular, oval, or any other shape known in the art. In an embodiment, the width of the second hole 575 closest to second power rail 128 is smaller than the width of second power rail 128.

Figure 6:
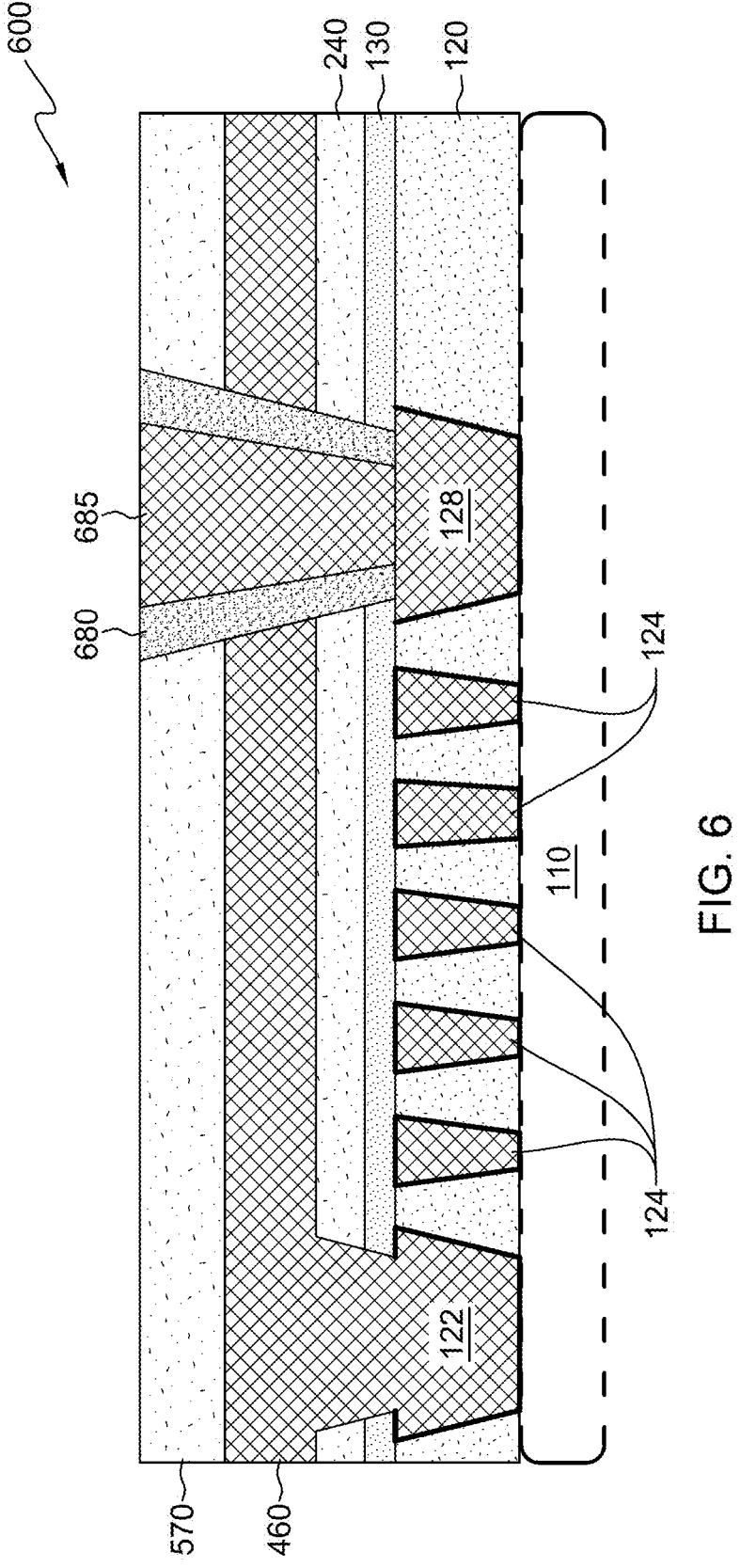
FIG. 6 is a cross-sectional view of a semiconductor device, generally designated 600, in accordance with a first embodiment of the invention.

FIG. 6 is a cross-sectional view of a semiconductor device, generally designated 600, in accordance with a first embodiment of the invention. In an embodiment, via dielectric layer 680 is deposited within second hole 575. In an embodiment, an etch may be used to remove at least part of the dielectric layer to form an opening in which via layer will be deposited. In an embodiment, via dielectric layer 680 may be substantially similar to capping dielectric layer 130. In an embodiment, via dielectric layer 680 may be the same material as capping dielectric layer 130. In an embodiment, via dielectric layer 680 may be a different material than capping dielectric layer 130. In an embodiment, via dielectric layer 680 may be a material that hermetically seals the via layer 685 from surrounding dielectric layers, such as second ILD 240 and third ILD 570. In an embodiment, via layer 685 is a metal layer that is deposited between via dielectric layer 680 and in contact with second power rail 128. In an embodiment, via layer 685 may be the same material as second power rail 128. In an alternative embodiment, via layer 685 may be a different material than second power rail 128. In an embodiment, there may be any number of via layer 685 formed any orientation or pattern connecting second power rail 128 to other layers (not shown).

It should be noted, after deposition of dielectric layer 680 and via layer 685, processing steps found in FIGS. 1-6 may be repeated. In other words, additional capping dielectric layers, interlayer dielectric, metal layer, and power planes may be deposited and formed. For example, via layer 685 may electrically connect the second power rail 128 to a second power plane (not shown) that is found above the via layer 685. Additionally, processing steps found in FIGS. 1-6 may occur multiple times at the same time, in other words forming multiple vias in the same processing.

Figure 7:
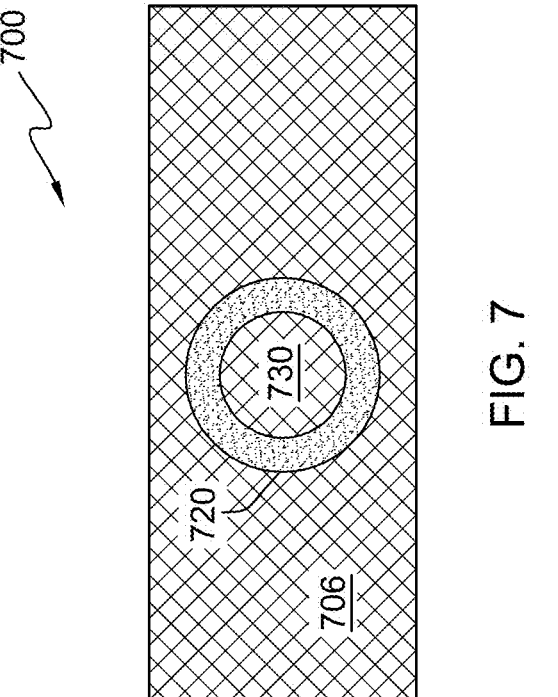
FIG. 7 is a top view of a via, generally designated 700, in accordance with a first embodiment of the invention.

FIG. 7 is a top view of a via, generally designated 700, in accordance with a first embodiment of the invention. In an embodiment, power plane 706 is a metal layer substantially similar to power plane 460, discussed above. In an embodiment, dielectric layer 720 is a dielectric layer that is substantially similar to via dielectric layer 680, discussed above. In an embodiment, via 730 is a metal layer substantially similar to via layer 685, discussed above. Via 730 is isolated from power plane 706 by dielectric layer 720. In an embodiment, as noted above, via 730 may be circular in shape, as shown. In an alternative embodiment, via 730 may be any shape known in the art.

Figure 8:
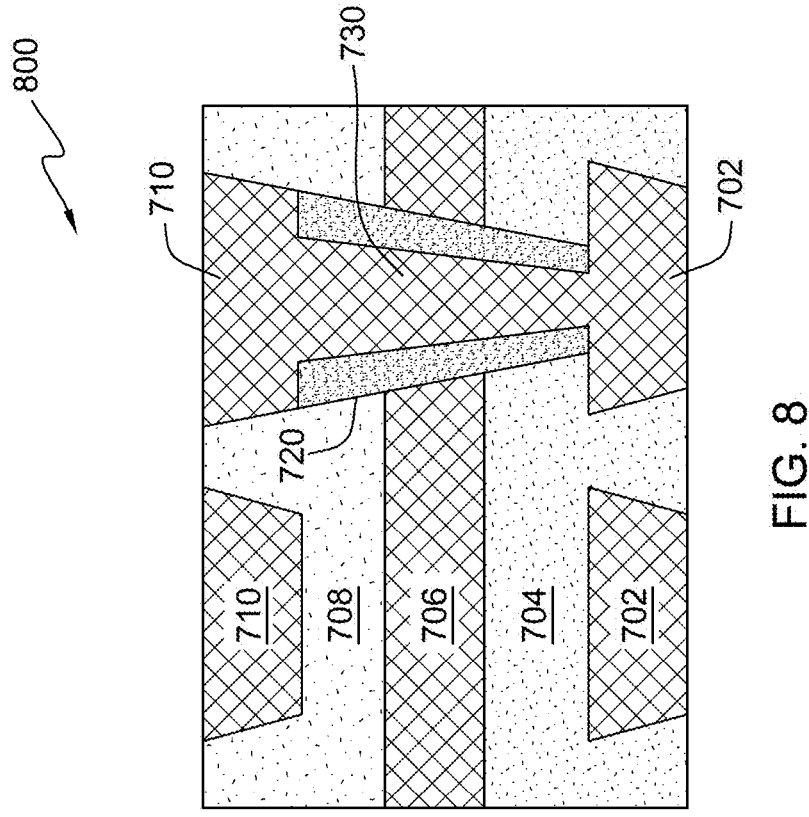
FIG. 8 is a cross-sectional view of a via, generally designated 800, in accordance with a first embodiment of the invention.

FIG. 8 is a cross-sectional view of a via, generally designated 800, in accordance with a first embodiment of the invention. In an embodiment, first power rail 702 is a metal layer substantially similar to first power rail 122 and/or second power rail 128. In an embodiment, second power rail 710 is a metal layer substantially similar to first power rail 122 and/or second power rail 128. As show in FIG. 8, first power rail 702 is on a metal layer below second power rail 710. In an embodiment, first ILD 704 is an interlayer dielectric that is substantially similar to first ILD 120. In an embodiment, first ILD 704 isolates first power rail 702 from power plane 706. In an embodiment, second ILD 708 is an interlayer dielectric that is substantially similar to third ILD 570. In an embodiment, second ILD 708 isolates the second power rail 710 from power plane 706. It should be noted, a dielectric capping layer between metal layers and dielectric layers is not shown but may be found in some or all embodiments, as discussed in FIGS. 1-6.

In an embodiment, power plane 706 is a metal layer that is substantially similar to power plane 460. In an embodiment, via dielectric layer 720 is a dielectric layer that is substantially similar to via dielectric layer 680. In an embodiment, via 730 is a metal layer that electrically connects first power rail 702 and second power rail 710. In an embodiment, via 730 is isolated from first ILD 704, second ILD 708 and power plane 706 by the via dielectric layer 720.

Referring now to various embodiments of the invention in more detail, FIGS. 9-16 are a view of a semiconductor device, in accordance with a second embodiment of the invention. FIGS. 9-16 provide only an illustration of one implementation and do not imply any limitation with regard to the environments in which different embodiments may be implemented. Many modifications to the depicted environment may be made by those skilled in the art without departing from the scope of the invention as recited by the claims.

Figures 9, 10:
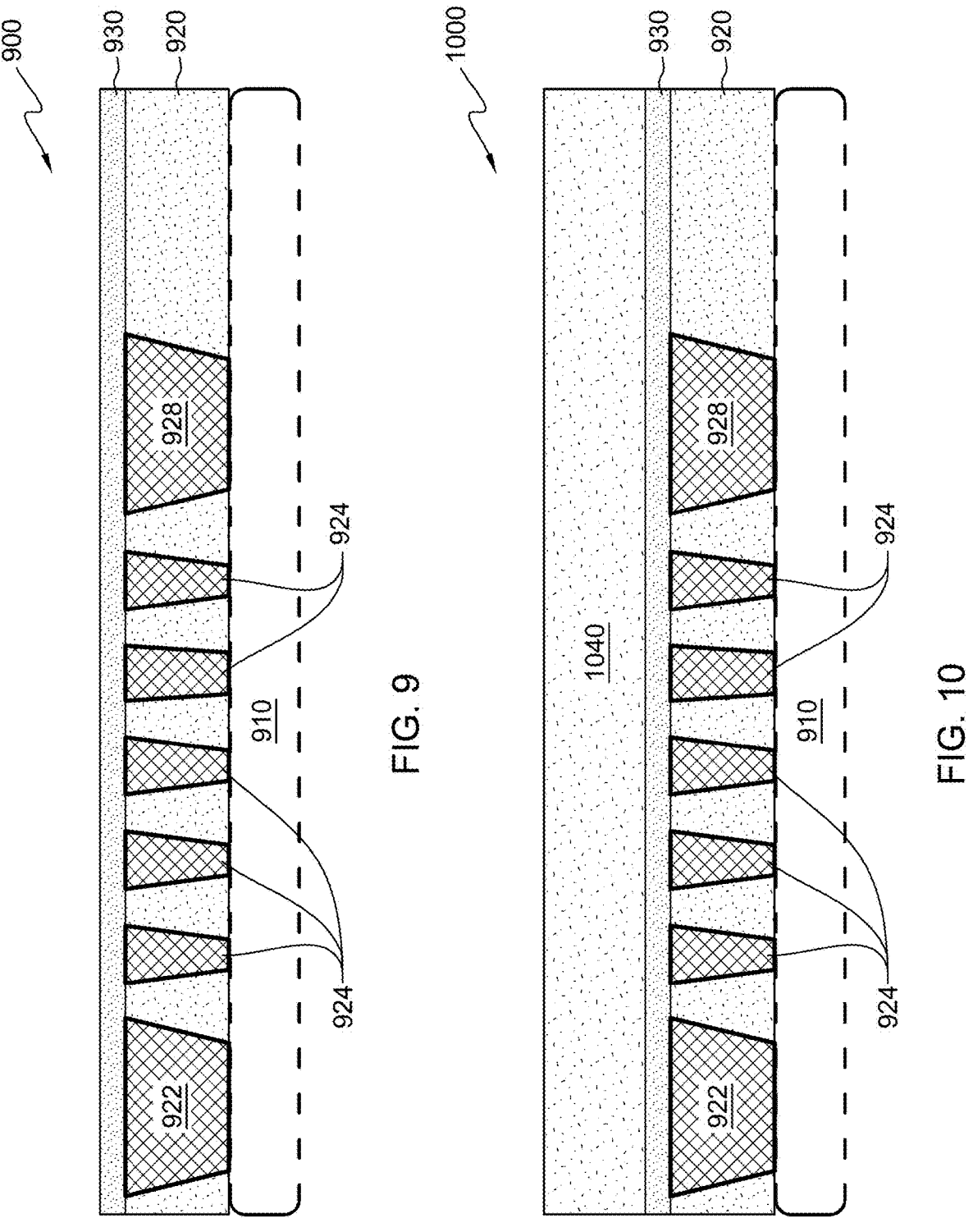
FIG. 9 is a cross-sectional view of a semiconductor device, generally designated 900, in accordance with a second embodiment of the invention.
FIG. 10 is a cross-sectional view of a semiconductor device, generally designated 1000, in accordance with a second embodiment of the invention.

FIG. 9 is a cross-sectional view of a semiconductor device, generally designated 900, in accordance with a second embodiment of the invention. In a second embodiment, a first interlayer dielectric (ILD) 920 is deposited upon device region 910. In an embodiment, first ILD 920 may be a low-k dielectric material, such as but not limited to a $SiO_2$ based material or any other low-k dielectric material. In an embodiment, first ILD 920 may have a sufficiently high elastic modulus, particularly at tight-pitch, so that patterning of interconnects, especially very small interconnects, is feasible.

In an embodiment, device region 910 may consist of any number of levels or layers of semiconductor devices, including but not limited to standard cells, logic gates, transistors, etc. Device region 910 is connected to elements above the device region through processes known in the art. In an embodiment, any number of metal layers (not shown) may exist between device region 910 and elements (e.g., 920, 922, 924, 928) on top of device region 910. In an embodiment, device region 910 may be electrically connected to elements (e.g., 920, 922, 924, 928) on top of device region 910. Device region 910 extends in a direction perpendicular to the cross-sectional area shown in FIG. 9, to form a three dimensional area of devices.

In an embodiment, first ILD 920 is etched, using conventional lithographic and etching process known in the art, to form any number of trenches that will eventually form first power rail 922, second power rail 928 and signal tracks 924. It should be noted, first power rail 922, second power rail 928, and signal tracks 924 extend perpendicularly to the cross-sectional area shown in FIG. 9, to provide power and signal routing to the device region 910.

In an embodiment, a metal layer is deposited within the trenches, discussed above, to form first power rail 922, second power rail 928, and signal tracks 924. In an embodiment, first power rail 922 provides a voltage source (e.g. $V_{DD}$ or $V_{SS}$) to parts of the device region 910. In an embodiment, second power rail 928 provides a voltage source (e.g. $V_{DD}$ or $V_{SS}$) to parts of the device region 910. In an embodiment, signal tracks 924 provide signal wiring to parts of the device region 910. In an embodiment, semiconductor device 900 may include any number of first power rail 922, second power rail 928, and signal tracks 924. In an embodiment, conventional polishing or planarization processes may be used so first power rail 922, second power rail 928, signal tracks 924 and first ILD 920 have a substantially similar height.

In an embodiment, first dielectric capping layer 930 is deposited on first power rail 922, second power rail 928, signal tracks 924 and first ILD 920. In an embodiment, first dielectric capping layer 930 may have a higher dielectric constant than first ILD 920. In an embodiment, first dielectric capping layer 930 may be dense enough to act as a hermetic seal between layers above/below the first dielectric capping layer 930. In an embodiment, first dielectric capping layer 930 may be, but is not limited to, SiN, AlN, AlO, etc.

FIG. 10 is a cross-sectional view of a semiconductor device, generally designated 1000, in accordance with a second embodiment of the invention. In an embodiment, a second ILD 1040 is deposited upon first dielectric capping layer 930. In an embodiment, second ILD 1040 may be a low-k dielectric material, such as but not limited to a $SiO_2$ based material or any other low-k dielectric material. In an embodiment, second ILD 1040 may have a sufficiently high elastic modulus, particularly at tight-pitch, so that patterning of interconnects, especially very small interconnects, is feasible. In an embodiment, second ILD 1040 is substantially similar to first ILD 920. In an embodiment, after deposition of second ILD 1040 a planarization and/or polishing step may occur, such as but not limited to CMP.

Figure 11:
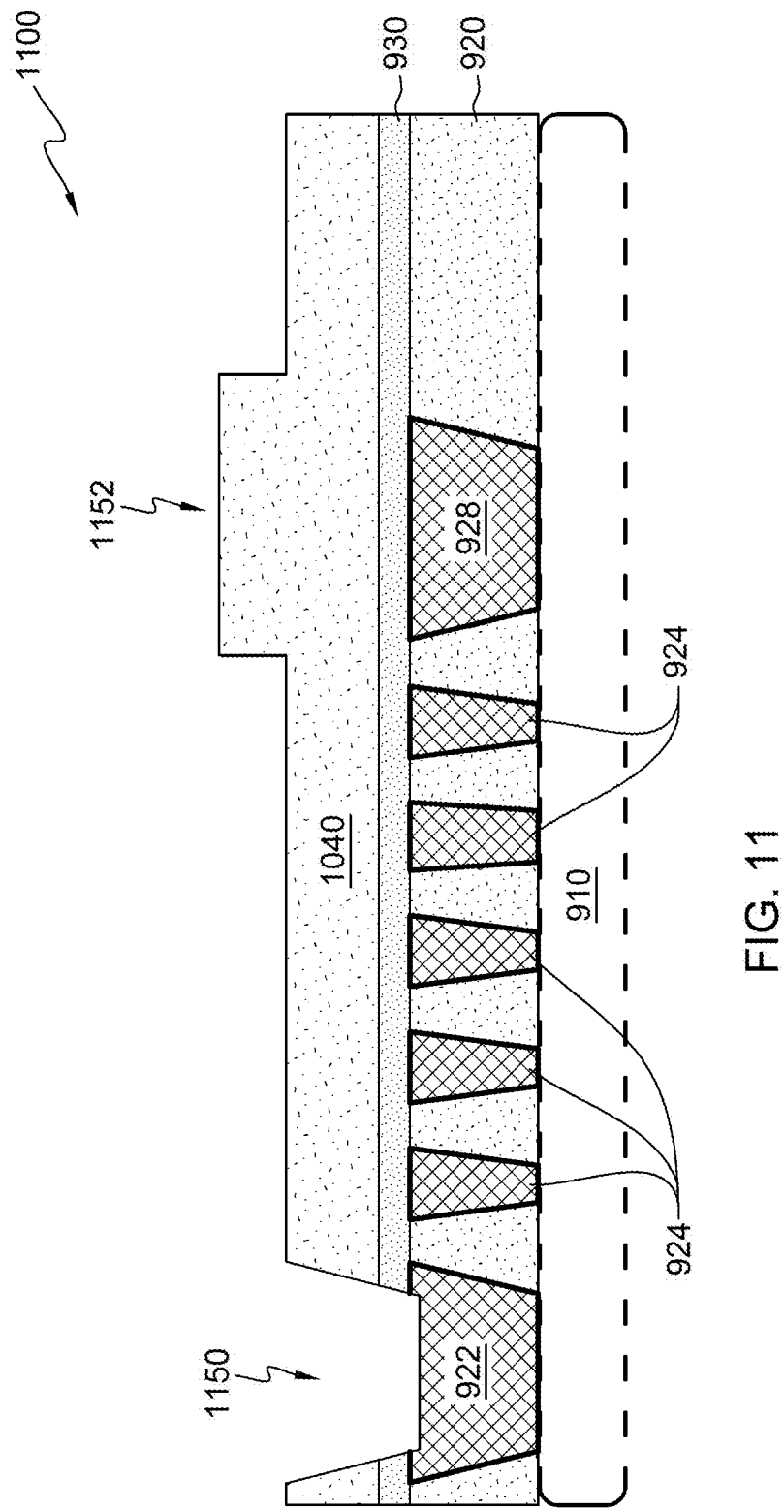
FIG. 11 is a cross-sectional view of a semiconductor device, generally designated 1100, in accordance with a second embodiment of the invention.

FIG. 11 is a cross-sectional view of a semiconductor device, generally designated 1100, in accordance with a second embodiment of the invention. In an embodiment, first hole 1150 is etched within second ILD 1040 and first dielectric capping layer 930 using processes known in the art. In an embodiment, first hole 1150, discussed below, will become a via between a power plane (not shown) and first power rail 922. In an embodiment, there may be any number of first hole 1150 etched within second ILD 1040 and first dielectric capping layer 930. In other words, any number of via may eventually electrically connect the power plane (not shown) and first power rail 922. In an embodiment, first hole 1150 may be circular, as discussed below in FIGS. 15 and 16, square, triangular, oval or any other shape known in the art. In an embodiment, the width of the first hole 1150 closest to first power rail 922 is smaller than the width of first power rail 922. In an embodiment, after etching of second ILD 1040 a first bump 1152 remains. In an embodiment, first bump 1152 is wider than a width of second power rail 928. In an alternative embodiment, first bump 1152 is a same width as second power rail 928. In an embodiment, first bump 1152 is square shape, circular shaped, oval shaped, or any other shape known in the art. In an embodiment, first bump 1152 is an area profile that is large enough to eventually form a via that will connect second power rail 928 to metal levels on top of power plane 1260, discussed below.

Figures 12, 13:
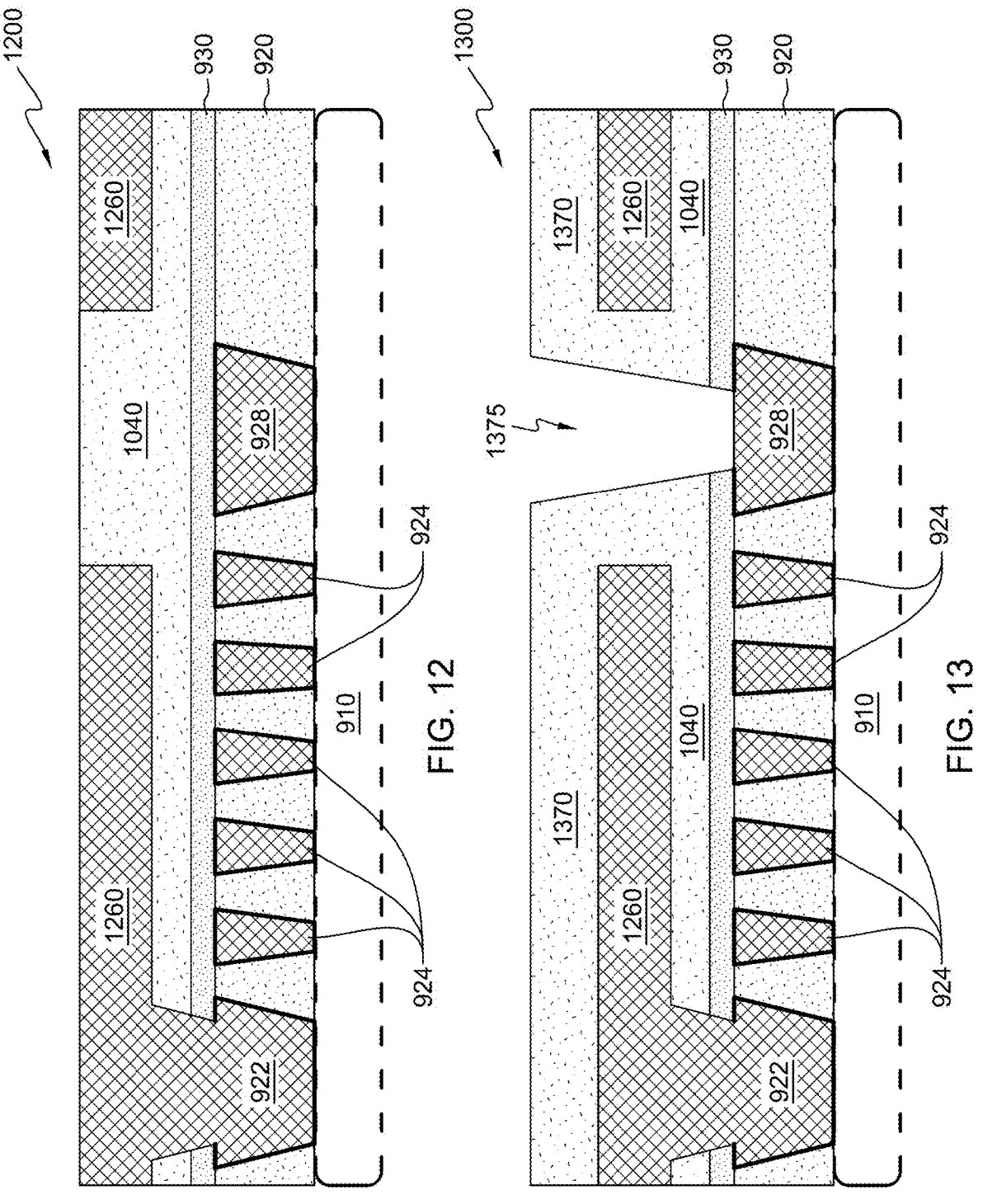
FIG. 12 is a cross-sectional view of a semiconductor device, generally designated 1200, in accordance with a second embodiment of the invention.
FIG. 13 is a cross-sectional view of a semiconductor device, generally designated 1300, in accordance with a second embodiment of the invention.

FIG. 12 is a cross-sectional view of a semiconductor device, generally designated 1200, in accordance with a second embodiment of the invention. In an embodiment, power plane 1260 is deposited on top of second ILD 1040 and within first hole 1150. In an embodiment, power plane 1260 extends in a direction perpendicular to the cross-sectional area shown in FIG. 12, to form a three dimensional power plane on top of second ILD 1040. In an embodiment, the three dimensional shape of the power plane 1260 may be square, rectangular, triangular, circular, an irregular shape, or any combination in shape in the direction that is perpendicular to the cross-sectional area shown in FIG. 12. In an embodiment, the power plane 1260 that is deposited within first hole 1150 forms a via between the horizontal power plane 1260 that is formed on top of second ILD 1040. In an embodiment, power plane 1260 is electrically connected to the first power rail 922 using the via discussed above. As discussed above, there may be any number of via in any orientation or pattern connecting power plane 1260 and first power rail 922. In an embodiment, power plane 1260 is deposited around and on top of first bump 1152. In an embodiment, after deposition of power plane 1260 a planarization and/or polishing step may occur, such as but not limited to CMP, to form the height of power plane 1260 and second ILD 1040 at a similar height. In an embodiment, power plane 1260 and first power rail 922 may be the same material. In an alternative embodiment, power plane 1260 and first power rail 922 may be a different material. In an embodiment, power plane 1260 may be a metal, including but not limited to, TiN, TaN, W, Ru, Co, etc.

FIG. 13 is a cross-sectional view of a semiconductor device, generally designated 1300, in accordance with a second embodiment of the invention. In an embodiment, third ILD 1370 is deposited on top of power plane 1260 and first bump 1152. In an embodiment, third ILD 1370 may be a low-k dielectric material, such as but not limited to a SiO$_2$ based material or any other low-k dielectric material. In an embodiment, third ILD 1370 may have a sufficiently high elastic modulus, particularly at tight-pitch, so that patterning of interconnects, especially very small interconnects, is feasible. In an embodiment, third ILD 1370 is substantially similar to first ILD 920 and/or second ILD 1040. In an embodiment, after deposition of third ILD 1370 a planarization and/or polishing step may occur, such as but not limited to CMP.

In an embodiment, the third ILD 1370, power plane 1260, second ILD 1040 and dielectric capping layer 930 are etched to form second hole 1375 expose portions of second power rail 928. In an embodiment, second hole 1375 may be substantially similar to first hole 1150. In other words, second hole 1375 will become a via between a power plane (not shown) or other metal layer interconnect and second power rail 928. In an embodiment, there may be any number of second hole 1375 etched within the third ILD 1370, power plane 1260, second ILD 1040 and dielectric capping layer 930. In other words, any number of via may electrically connect a power plane (not shown) or other metal layer interconnect above the second power rail 928 and the second power rail 928. In an embodiment, second hole 1375 may be circular, as discussed below in FIGS. 15 and 16, square, triangular, oval or any other shape known in the art. In an embodiment, the width of the second hole 1375 closest to second power rail 928 is smaller than the width of second power rail 928.

Figure 14:
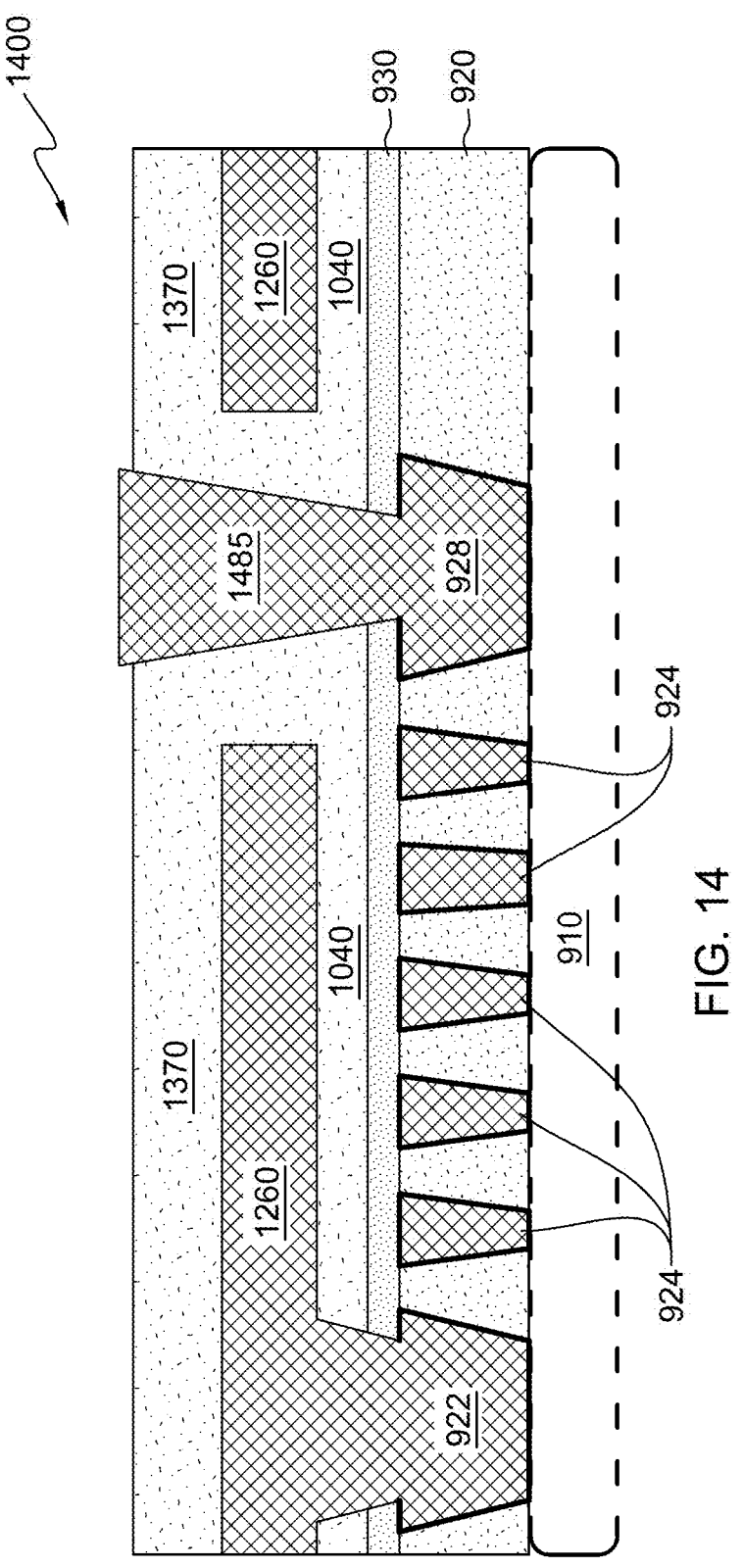
FIG. 14 is a cross-sectional view of a semiconductor device, generally designated 1400, in accordance with a second embodiment of the invention.

FIG. 14 is a cross-sectional view of a semiconductor device, generally designated 1400, in accordance with a second embodiment of the invention. In an embodiment, via layer 1485 is deposited within second hole 575. In an embodiment, via layer 1485 is a metal layer that is deposited within second hole 1375 and in contact with second power rail 928. In an embodiment, via layer 1485 may be the same material as second power rail 928. In an alternative embodiment, via layer 1485 may be a different material than second power rail 928. In an embodiment, there may be any number of via layer 1485 formed any orientation or pattern connecting second power rail 128 to other layers (not shown).

It should be noted, after deposition of via layer 1485, processing steps found in FIGS. 9-14 may be repeated. In other words, additional capping dielectric layers, interlayer dielectric, metal layer, and power planes may be deposited and formed. For example, via layer 1485 may electrically connect the second power rail 928 to a second power plane (not shown) that is found above the via layer 1485. Additionally, processing steps found in FIGS. 9-14 may occur multiple times at the same time, in other words forming multiple vias in the same processing.

Figures 15, 16:
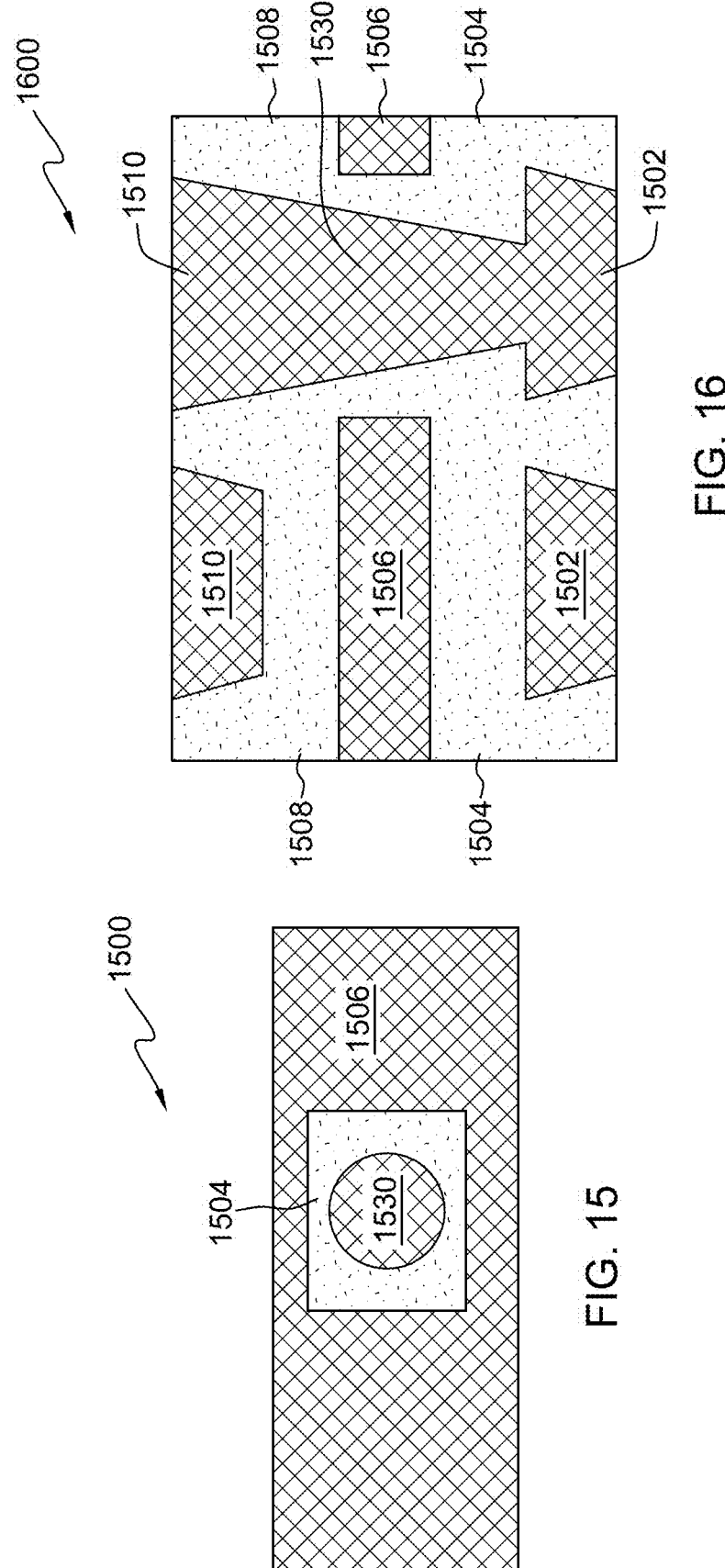
FIG. 15 is a top view of a via, generally designated 1500, in accordance with a second embodiment of the invention.
FIG. 16 is a cross-sectional view of a via, generally designated 1600, in accordance with a second embodiment of the invention.

FIG. 15 is a top view of a via, generally designated 1500, in accordance with a second embodiment of the invention. In an embodiment, power plane 1506 is a metal layer substantially similar to power plane 1260, discussed above. In an embodiment, dielectric layer 1504 is a dielectric layer that is substantially similar to second ILD 1040, discussed above. In an embodiment, via 1530 is a metal layer substantially similar to via layer 1485, discussed above. Via layer 1530 is isolated from power plane 1506 by dielectric layer 1504. In an embodiment, via 1530 may be circular in shape, as shown. In an alternative embodiment, via 1530 may be any shape known in the art.

FIG. 16 is a cross-sectional view of a via, generally designated 1600, in accordance with a second embodiment of the invention. In an embodiment, first power rail 1502 is a metal layer substantially similar to first power rail 922 and/or second power rail 928. In an embodiment, second power rail 1510 is a metal layer substantially similar to first power rail 922 and/or second power rail 928. As show in FIG. 15, first power rail 1502 is on a metal layer below second power rail 1510. In an embodiment, dielectric layer 1504 is an interlayer dielectric that is substantially similar to first ILD 920. In an embodiment, dielectric layer 1504 isolates first power rail 1502 from power plane 1506. In an embodiment, second ILD 1508 is an interlayer dielectric that is substantially similar to third ILD 1370. In an embodiment, second ILD 1508 isolates the second power rail 1510 from power plane 1506. It should be noted, a dielectric capping layer between metal layers and dielectric layers is not shown but may be found in some or all embodiments, as discussed in FIGS. 9-14.

In an embodiment, power plane 1506 is a metal layer that is substantially similar to power plane 1260. In an embodiment, via 1530 is a metal layer that electrically connects first power rail 1502 and second power rail 1510. In an embodiment, via 1530 is isolated from power plane 1506 by the dielectric layer 1504 and second ILD 1508.

Referring now to various embodiments of the invention in more detail, FIGS. 17-26 are a view of a semiconductor device, in accordance with a third embodiment of the invention. FIGS. 17-26 provide only an illustration of one implementation and do not imply any limitation with regard to the environments in which different embodiments may be implemented. Many modifications to the depicted environment may be made by those skilled in the art without departing from the scope of the invention as recited by the claims.

Figures 17, 18:
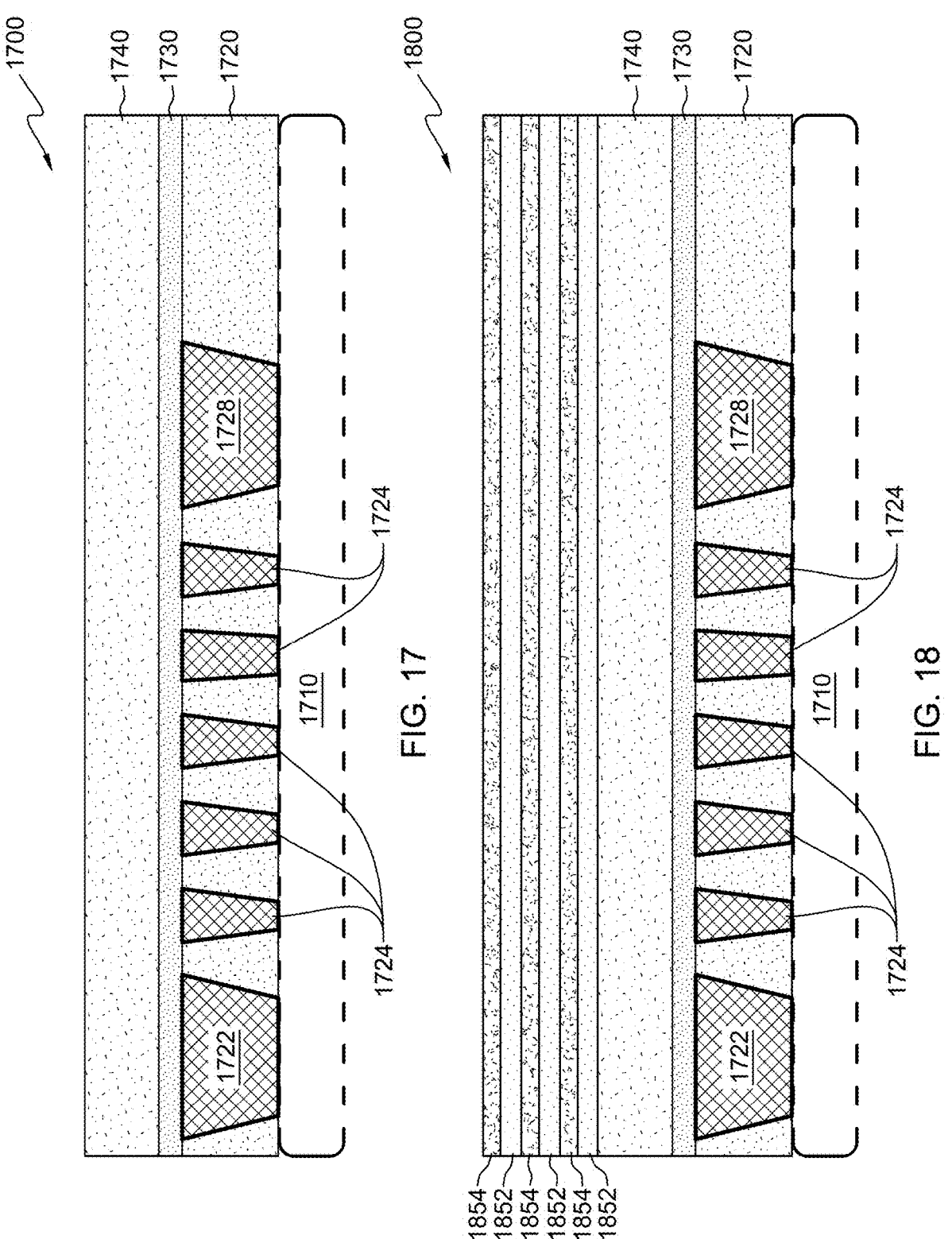
FIG. 17 is a cross-sectional view of a semiconductor device, generally designated 1700, in accordance with a third embodiment of the invention.
FIG. 18 is a cross-sectional view of a semiconductor device, generally designated 1800, in accordance with a third embodiment of the invention.

FIG. 17 is a cross-sectional view of a semiconductor device, generally designated 1700, in accordance with a third embodiment of the invention. In a third embodiment, a first interlayer dielectric (ILD) 1720 is deposited upon device region 1710. In an embodiment, first ILD 1720 may be a low-k dielectric material, such as but not limited to a SiO$_2$ based material or any other low-k dielectric material. In an embodiment, first ILD 1720 may have a sufficiently high elastic modulus, particularly at tight-pitch, so that patterning of interconnects, especially very small interconnects, is feasible.

In an embodiment, device region 1710 may consist of any number of levels or layers of semiconductor devices, including but not limited to standard cells, logic gates, transistors, etc. Device region 1710 is connected to elements above device region through processes known in the art. In an embodiment, any number of metal layers (not shown) may exist between device region 1710 and elements (e.g., 1720, 1722, 1724, 1728) on top of device region 1710. In an embodiment, device region 1710 may be electrically connected to elements (e.g., 1720, 1722, 1724, 1728) on top of device region 1710. Device region 1710 extends in a direction perpendicular to the cross-sectional area shown in FIG. 17, to form a three dimensional area of devices.

In an embodiment, first ILD 1720 is etched, using conventional lithographic and etching process known in the art, to form any number of trenches that will eventually form first power rail 1722, second power rail 1728 and signal tracks 1724. It should be noted, first power rail 1722, second power rail 1728, and signal tracks 1724 extend perpendicularly to the cross-sectional area shown in FIG. 17, to provide power and signal routing to the device region 1710.

In an embodiment, a metal layer is deposited within the trenches, discussed above, to form first power rail 1722, second power rail 1728, and signal tracks 1724. In an embodiment, first power rail 1722 provides a voltage source (e.g. V$_{DD}$ or V$_{SS}$) to parts of the device region 1710. In an embodiment, second power rail 1728 provides a voltage source (e.g. V$_{DD}$ or V$_{SS}$) to parts of the device region 1710. In an embodiment, signal tracks 1724 provide signal wiring to parts of the device region 1710. In an embodiment, semiconductor device 1700 may include any number of first power rail 1722, second power rail 1728, and signal tracks 1724. In an embodiment, conventional polishing or planarization processes may be used so first power rail 1722, second power rail 1728, signal tracks 1724 and first ILD 1720 have a substantially similar height.

In an embodiment, first dielectric capping layer 1730 is deposited on first power rail 1722, second power rail 1728, signal tracks 1724 and first ILD 1720. In an embodiment, first dielectric capping layer 1730 may have a higher dielectric constant than first ILD 1720. In an embodiment, first dielectric capping layer 1730 may be dense enough to act as a hermetic seal between layers above/below the first dielectric capping layer 1730. In an embodiment, first dielectric capping layer 1730 may be, but is not limited to, SiN, AlN, AlO, etc.

In an embodiment, a second ILD 1740 is deposited upon first dielectric capping layer 1730. In an embodiment, second ILD 1740 may be a low-k dielectric material, such as but not limited to a SiO2 based material or any other low-k dielectric material. In an embodiment, second ILD 1740 may have a sufficiently high elastic modulus, particularly at tight-pitch, so that patterning of interconnects, especially very small interconnects, is feasible. In an embodiment, second ILD 1740 is substantially similar to first ILD 1720. In an embodiment, after deposition of second ILD 1740 a planarization and/or polishing step may occur, such as but not limited to CMP.

FIG. 18 is a cross-sectional view of a semiconductor device, generally designated 1800, in accordance with a third embodiment of the invention. In an embodiment, metal layer one 1852 is deposited on top of second ILD 1740. In an embodiment, metal layer one 1852 may be made of a metal material, including but not limited to, Cu, Co, Ru, Ta, Ti, W, Rh, Ir, Pt, Pd, Al, or any other metal known in the art. In an embodiment, metal layer one 1852 may be made of an intermetallic material, including but not limited to, CoSi, RhSi, TiN, TaN, or any other intermetallic material known in the art. In an embodiment, metal layer two 1854 is deposited on top of metal layer one 1852. In an embodiment, metal layer two 1854 may be made of a metal material, including but not limited to, Cu, Co, Ru, Ta, Ti, W, Rh, Ir, Pt, Pd, Al, or any other metal known in the art. In an embodiment, metal layer two 1854 may be made of an intermetallic material, including but not limited to, CoSi, RhSi, TiN, TaN, or any other intermetallic material known in the art. In an embodiment, the thickness of metal layer one 1852 and metal layer two 1854 may be smaller than a critical dimension of one or more via, discussed below. In an embodiment, any number of metal layer one 1852 and metal layer two 1854 may be alternated in deposition on top of second ILD 1740. As shown in FIG. 18, three layers of metal layer one 1852 are formed and three metal layers of metal layer two 1854 are formed. In an embodiment, after deposition of metal layer one 1852 or metal layer two 1854, a planarization, such as CMP, may occur. In an embodiment, the alternating metal layer one 1852 and metal layer two 1854 form a power plane, similar to power plane 460 and power plane 1260. For simplicity, the alternating layers of metal layer one 1852 and metal layer two 1854 are not shown with vias connecting to power rails on above or below metal layers, however, in an embodiment, the alternating layers of metal layer one 1852 and metal layer two 1854 may be connected to a power rail, such as power rail 1722 through a via, discussed above. In an embodiment, metal layer one 1852 and metal layer two 1854 extend in a direction perpendicular to the cross-sectional area shown in FIG. 18, to form a three dimensional power plane on top of second ILD 1740. In an embodiment, the three dimensional shape of metal layer one 1852 and metal layer two 1854 may be square, rectangular, triangular, circular, an irregular shape, or any combination of shape in the direction that is perpendicular to the cross-sectional area shown in FIG. 18.

Figure 19:
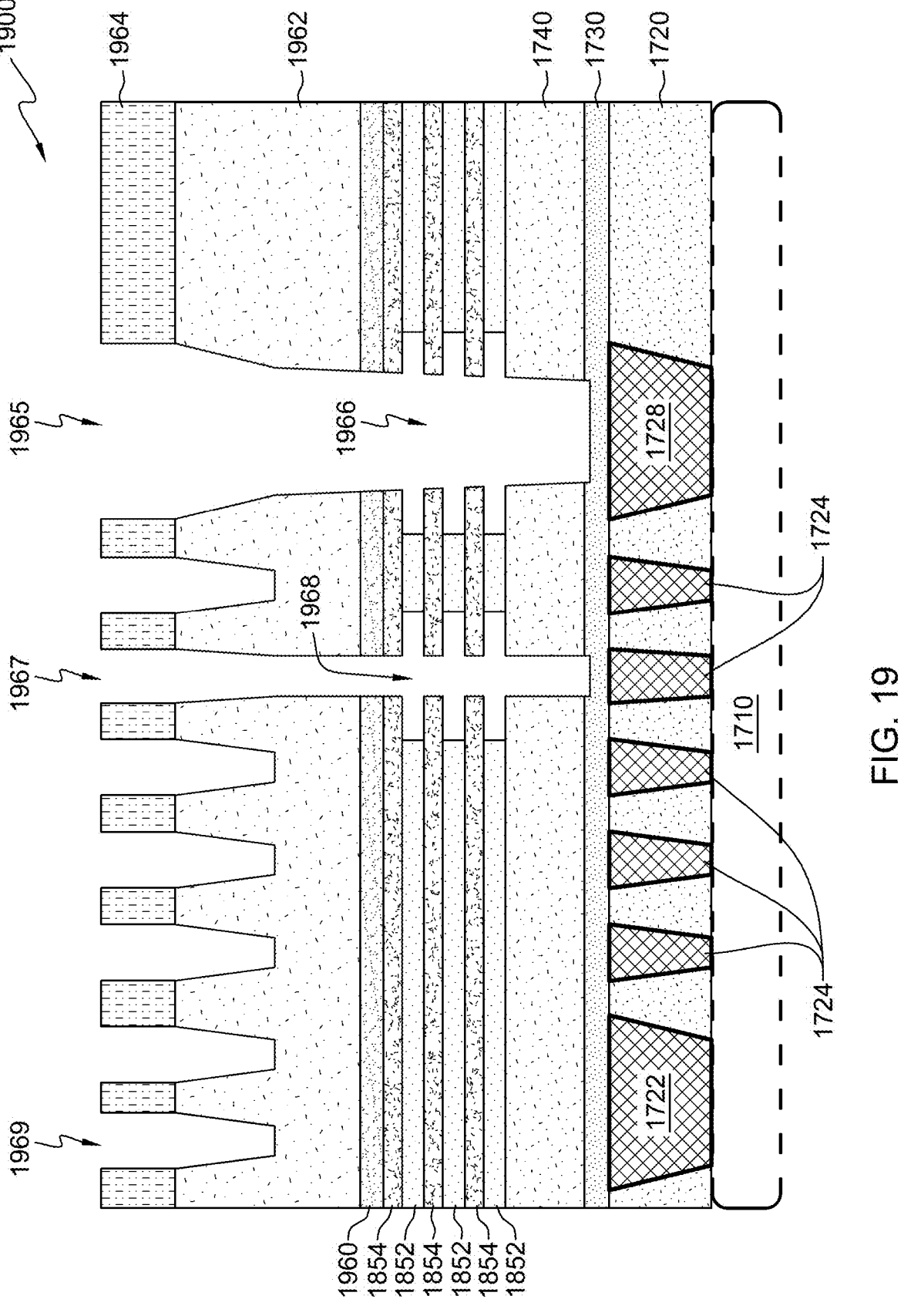
FIG. 19 is a cross-sectional view of a semiconductor device, generally designated 1900, in accordance with a third embodiment of the invention.

FIG. 19 is a cross-sectional view of a semiconductor device, generally designated 1900, in accordance with a third embodiment of the invention. In an embodiment, a second dielectric capping layer 1960 is deposited on top of metal layer two 1854. In an embodiment, the second dielectric capping layer 1960 may be deposited on top of metal layer one 1852 if metal layer one 1852 is the top layer in the alternating of metal layer one 1852 and metal layer two 1854. In an embodiment, second dielectric capping layer 1960 may have a higher dielectric constant than metal layer one 1852 or metal layer two 1854. In an embodiment, second dielectric capping layer 1960 may be dense enough to act as a hermetic seal between layers above/below the second dielectric capping layer 1760. In an embodiment, second dielectric capping layer 1760 may be, but is not limited to, SiN, AlN, AlO, etc.

In an embodiment, third ILD 1962 is deposited on top of second dielectric capping layer 1960. In an embodiment, third ILD 1962 may be a low-k dielectric material, such as but not limited to a SiO$_2$ based material or any other low-k dielectric material. In an embodiment, third ILD 1962 may have a sufficiently high elastic modulus, particularly at tight-pitch, so that patterning of interconnects, especially very small interconnects, is feasible. In an embodiment, third ILD 1962 is substantially similar to first ILD 1720 and second ILD 1740. In an embodiment, after deposition of third ILD 1962 a planarization and/or polishing step may occur, such as but not limited to CMP.

In an embodiment, hard mask 1964 is deposited on top of third ILD 1962. In an embodiment, hard mask 1964 may be TiN or may be any other material, known in the art that may be used as a hard mask. In an embodiment, hard mask 1964 is patterned in order to form any number of power rail, signal tracks, and vias within third ILD 1962. In an embodiment, any number of signal track 1969 may be etched within the third ILD 1962. In an embodiment, a power via 1965 may be etched, using any process known in the art, within third ILD 1962, second dielectric capping layer 1960, metal layer one 1852, metal layer two 1854 and second ILD 1740. In an embodiment, power via 1965 is vertically aligned with second power rail 1728. In an embodiment, metal layer one removal 1966 occurs within the power via 1965 via etching or any other process known in the art. In an embodiment, a signal via 1967 may be etched, using any process known in the art, within third ILD 1962, second dielectric capping layer 1960, metal layer one 1852, metal layer two 1854 and second ILD 1740. In an embodiment, signal via 1967 is vertically aligned with a signal track 1724. In an embodiment, metal layer one removal 1968 occurs within the signal via 1967 via etching or any other process known in the art. In an embodiment, metal layer one 1852 is removed selectively to metal layer two 1854.

Figure 20:
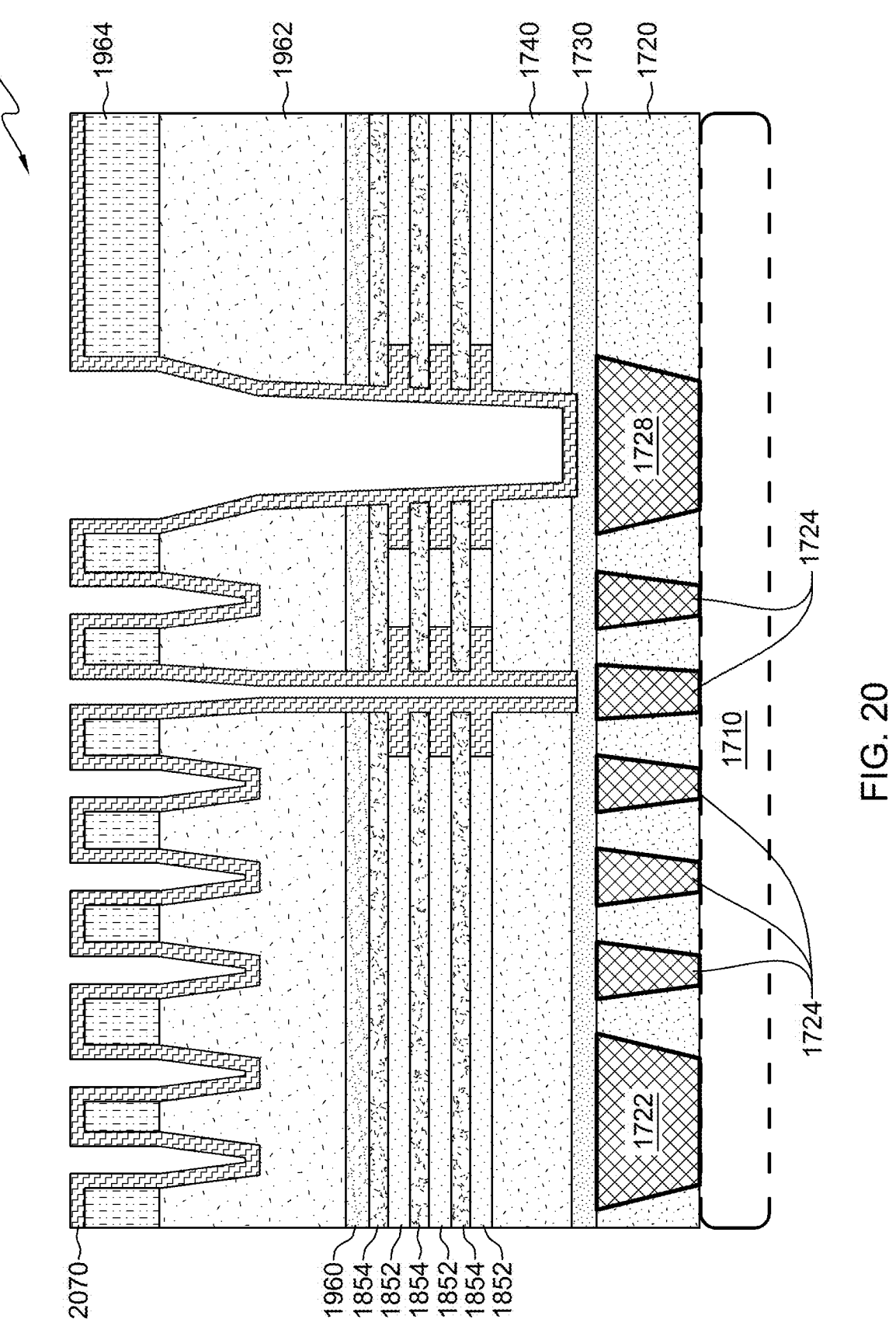
FIG. 20 is a cross-sectional view of a semiconductor device, generally designated 2000, in accordance with a third embodiment of the invention.

FIG. 20 is a cross-sectional view of a semiconductor device, generally designated 2000, in accordance with a third embodiment of the invention. In an embodiment, a dielectric liner 2070 is deposited on top of hard mask 1964, third ILD 1962, second dielectric capping layer 1960, metal layer one 1852, metal layer two 1854 and first ILD 1740 along with metal layer one removal 1966 and metal layer one removal 1968. In an embodiment, dielectric liner may be SiN, a SiN based material or other inner spacer material that will provide electrical isolation between the metal via to be formed and metal layer one 1852 and metal layer two 1854.

Figure 21:
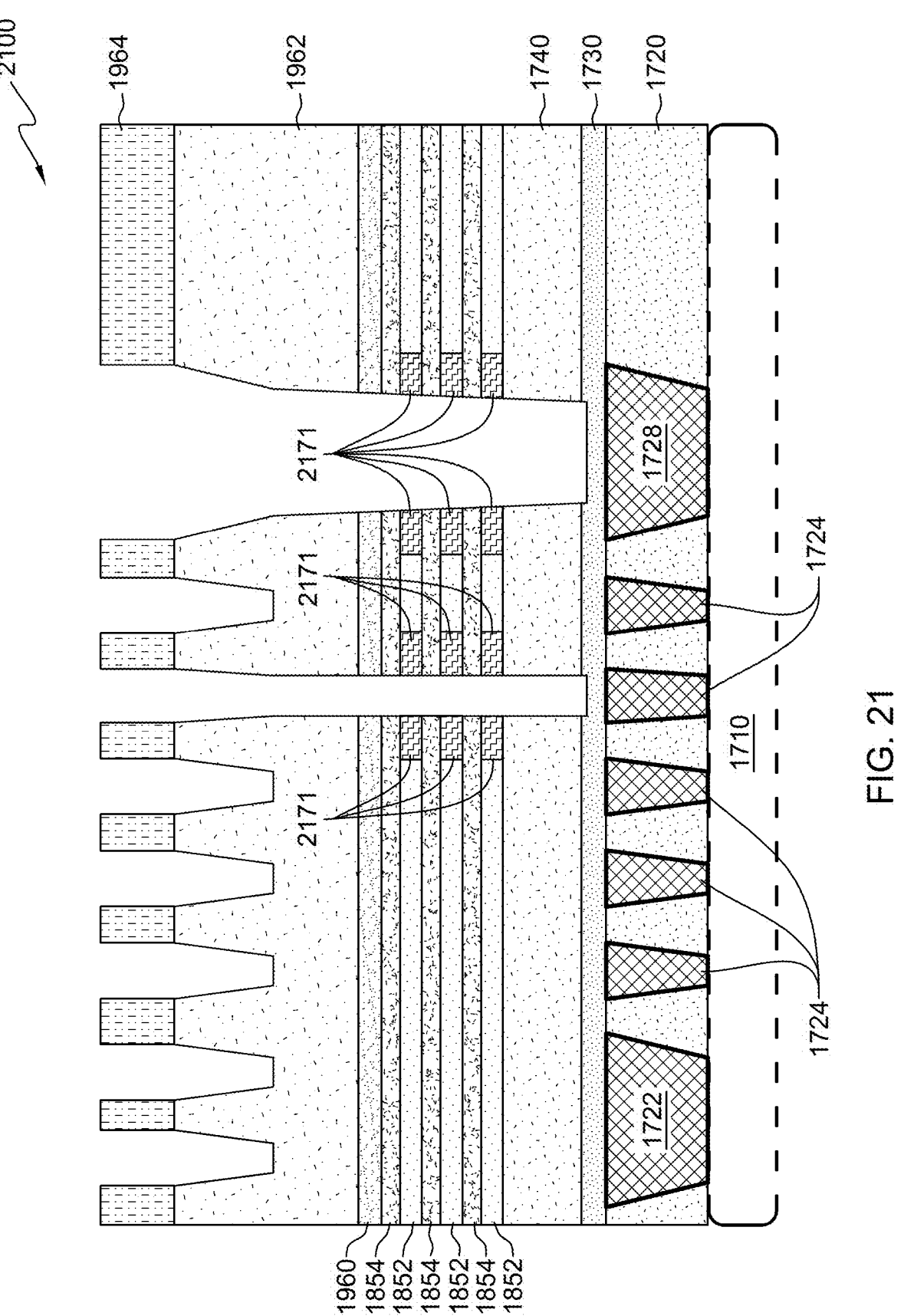
FIG. 21 is a cross-sectional view of a semiconductor device, generally designated 2100, in accordance with a third embodiment of the invention.

FIG. 21 is a cross-sectional view of a semiconductor device, generally designated 2100, in accordance with a third embodiment of the invention. In an embodiment, dielectric liner 2070 is isotropically etched in order to remove portions of dielectric liner 2070 but leave portions of dielectric liner found in metal layer one removal 1966 and metal layer one removal 1968. In an embodiment, first inner spacer 2171 remains within the power via 1965 and signal via 1967.

Figure 22:
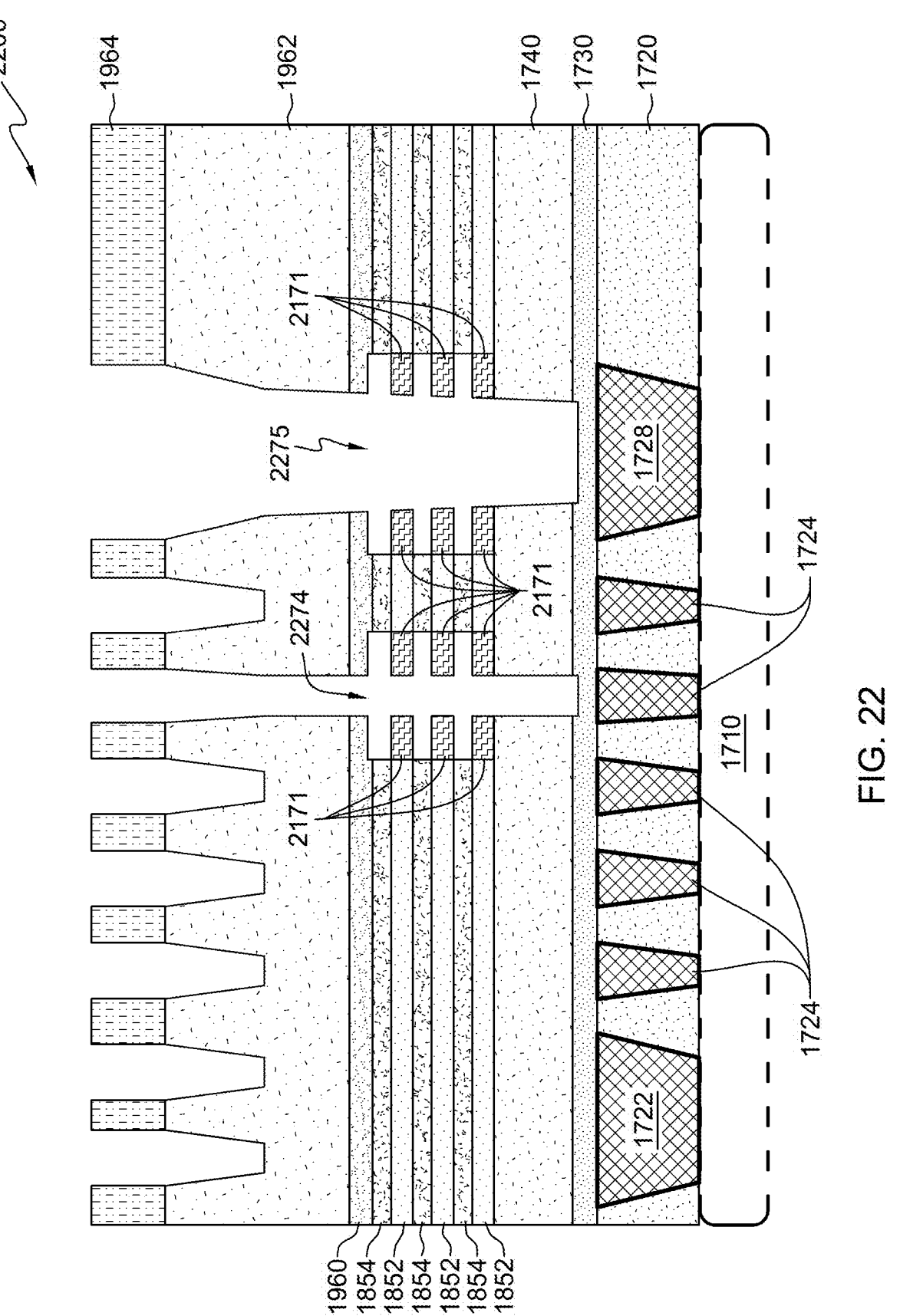
FIG. 22 is a cross-sectional view of a semiconductor device, generally designated 2200, in accordance with a third embodiment of the invention.

FIG. 22 is a cross-sectional view of a semiconductor device, generally designated 2200, in accordance with a third embodiment of the invention. In an embodiment, metal layer two removal 2275 occurs within the power via 1965 via etching or any other process known in the art. In an embodiment, metal layer two removal 2274 occurs within the signal via 1967 via etching or any other process known in the art. In an embodiment, metal layer two 1854 is removed selectively to metal layer one 1852 and inner spacer 2171.

Figure 23:
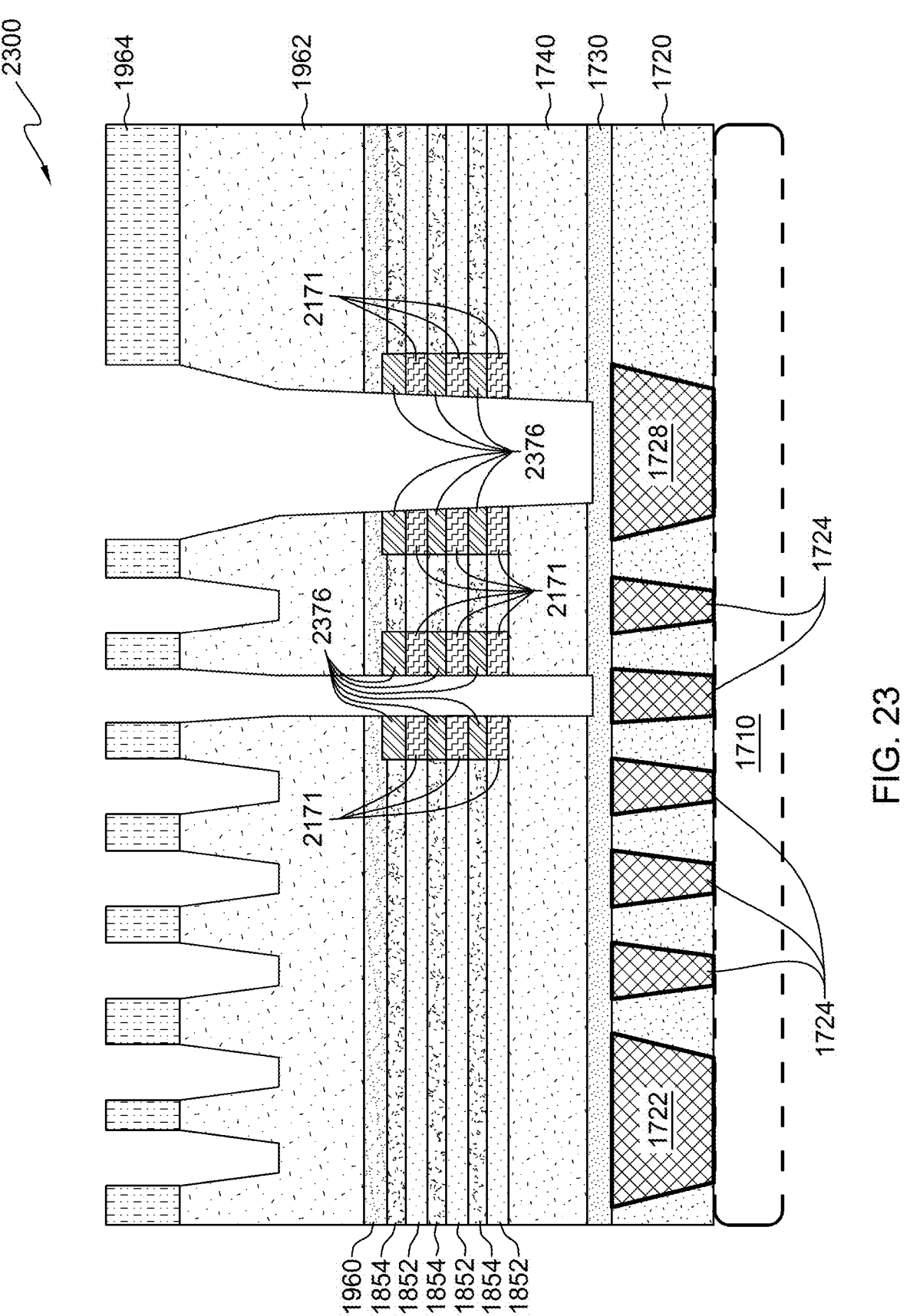
FIG. 23 is a cross-sectional view of a semiconductor device, generally designated 2300, in accordance with a third embodiment of the invention.

FIG. 23 is a cross-sectional view of a semiconductor device, generally designated 2300, in accordance with a third embodiment of the invention. In an embodiment, a dielectric liner 2376 is deposited on top of hard mask 1964, third ILD 1962, second dielectric capping layer 1960, metal layer one 1852, metal layer two 1854, second ILD 1740, first inner spacer 2171 along with metal layer two removal 2275 and metal layer two removal 2274. In an embodiment, dielectric liner 2736 may be SiN, a SiN based material or other inner spacer material that will provide electrical isolation between the metal via to be formed and metal layer one 1852 and metal layer two 1854. In an embodiment, dielectric liner 2376 is isotropically etched in order to remove portions of dielectric liner 2376 but leave portions of dielectric liner found in metal layer two removal 2274 and metal layer two 2275. In an embodiment, dielectric liner 2376 remains within the power via 1965 and signal via 1967 to form a second inner spacer. In an embodiment, first inner spacer 2171 and dielectric liner 2376 may be the same material. In an alternative embodiment, first inner spacer 2171 and dielectric liner 2376 may be a different material.

Figure 24:
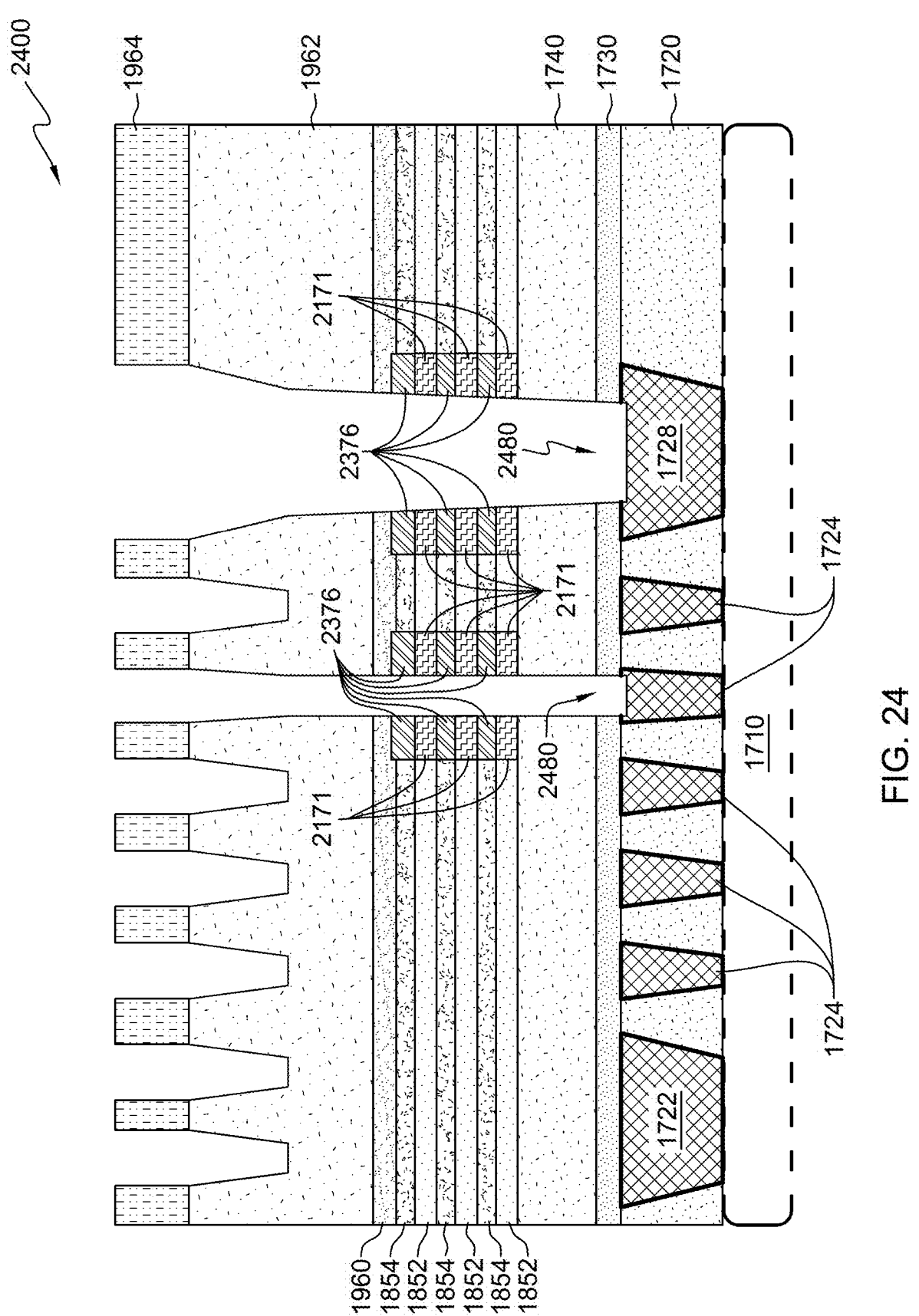
FIG. 24 is a cross-sectional view of a semiconductor device, generally designated 2400, in accordance with a third embodiment of the invention.

FIG. 24 is a cross-sectional view of a semiconductor device, generally designated 2400, in accordance with a third embodiment of the invention. In an embodiment, first dielectric capping layer 1730 is removed using any process known in the art in order to form dielectric cap opening 2480. In an embodiment, dielectric cap opening 2480 within power via 1965 and signal via 1967 exposes power rail 1728 and signal track 1724, respectively. In an embodiment, hard mask 1964 is then removed to expose portions of third ILD 1962.

Figure 25:
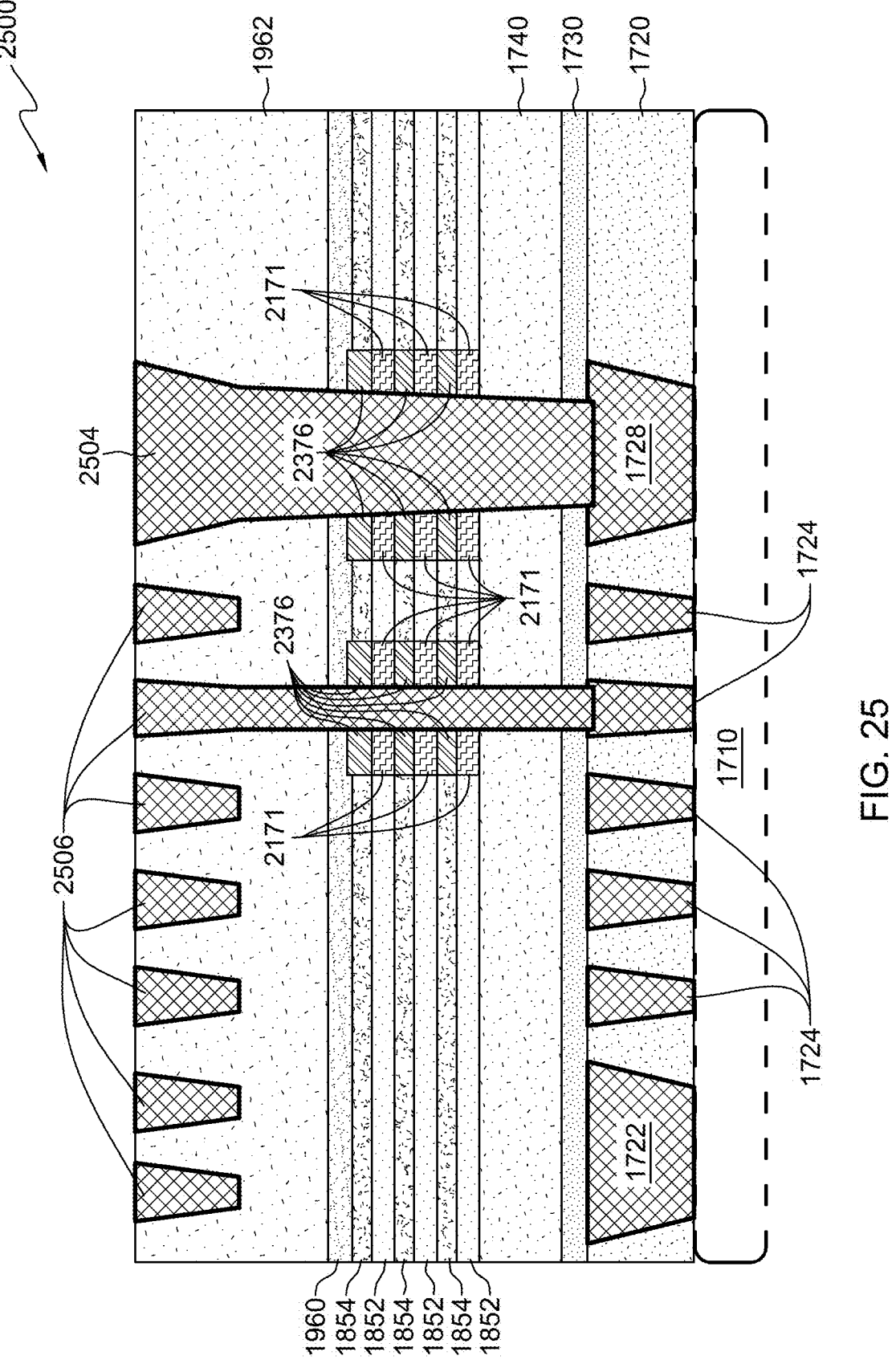
FIG. 25 is a cross-sectional view of a semiconductor device, generally designated 2500, in accordance with a third embodiment of the invention.
Figures 26, 27, 28:
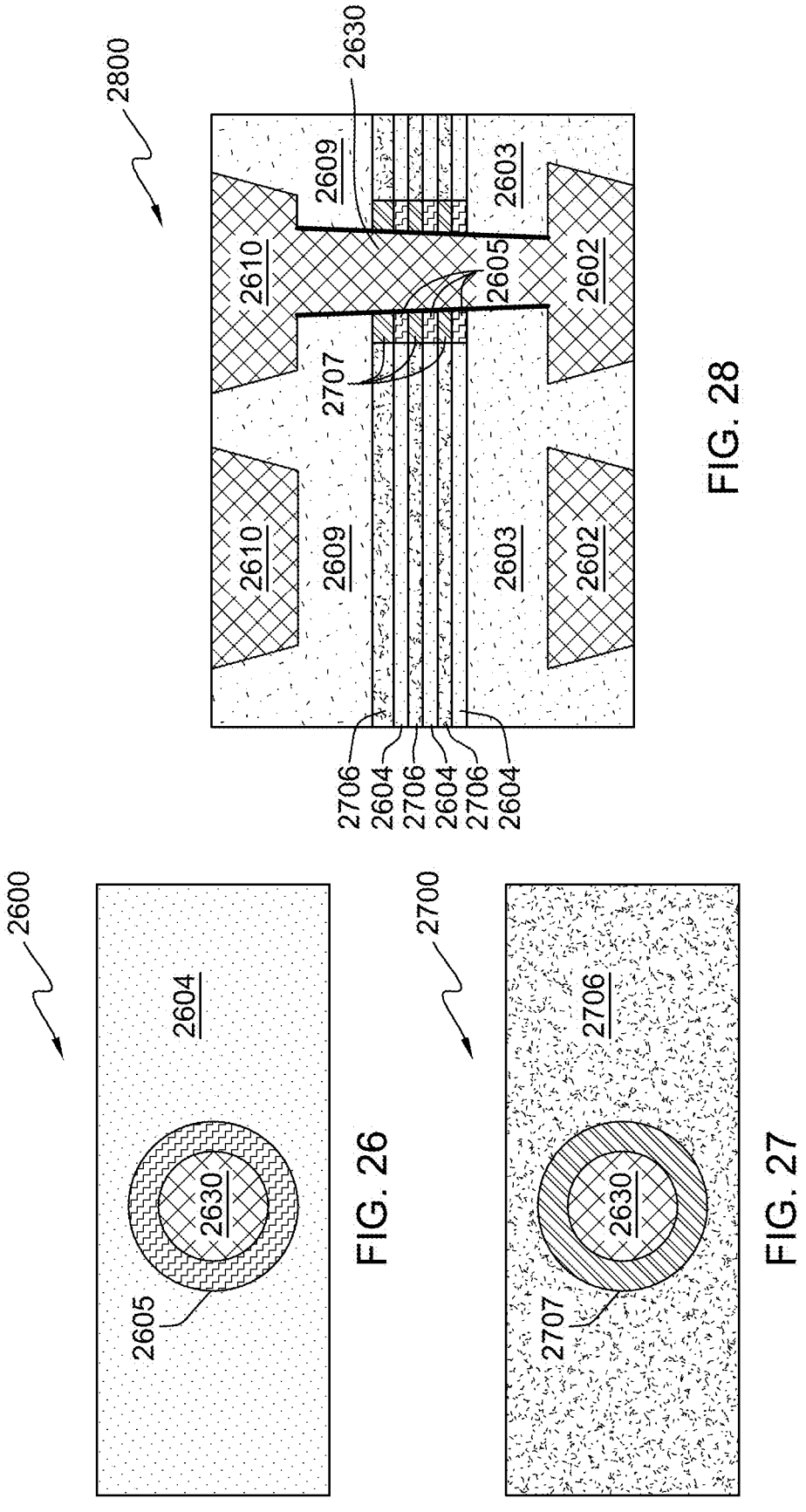
FIG. 26 is a top view of a via, generally designated 2600, in accordance with a third embodiment of the invention.
FIG. 27 is a top view of a via, generally designated 2700, in accordance with a third embodiment of the invention.
FIG. 28 is a cross-sectional view of a via, generally designated 2800, in accordance with a third embodiment of the invention.

FIG. 25 is a cross-sectional view of a semiconductor device, generally designated 2500, in accordance with a third embodiment of the invention. In an embodiment, a metal layer is deposited on top of third ILD 1962 and within power via 1965 and signal via 1967. In an embodiment, the metal layer is planarized to a height of the third ILD 1962. In an embodiment, signal tracks 2506 are formed after the removal of the metal layer to the height of the third ILD 1962. As shown in FIG. 25, a signal track 2506 has a via connecting a signal track 1724. In an embodiment, a power rail 2504 is formed after removal of the metal layer to the height of the third ILD 1962. As shown in FIG. 26, a power rail 2504 has a via connected to second power rail 1728.

It should be noted, processing steps found in FIGS. 17-28 may be repeated. In other words, additional capping dielectric layers, interlayer dielectric, metal layers, and power planes may be deposited and formed. Additionally, processing steps found in FIGS. 17-26 may occur multiple times at the same time, in other words forming multiple vias in the same processing.

FIG. 26 is a top view of a via, generally designated 2600, in accordance with a third embodiment of the invention. In an embodiment, metal layer one 2604 is a metal layer that is a layer of a power plane, substantially similar to power metal layer one 1852, discussed above. In an embodiment, dielectric layer 2605 is a dielectric layer that is substantially similar to first inner spacer 2171, discussed above. In an embodiment, via 2630 is a metal layer substantially similar to power rail 2504, discussed above. In an embodiment, via 2630 is isolated from metal layer one 2604 by dielectric layer 2605. In an embodiment, as noted above, via 2630 may be circular in shape, as shown. In an alternative embodiment, via 2630 may be any shape known in the art.

FIG. 27 is a top view of a via, generally designated 2700, in accordance with a third embodiment of the invention. In an embodiment, metal layer two 2706 is a metal layer that is a layer of a power plane, substantially similar to power metal layer two 1854, discussed above. In an embodiment, dielectric layer 2707 is a dielectric layer that is substantially similar to dielectric liner 2376, discussed above. In an embodiment, via 2630 is a metal layer substantially similar to power rail 2504, discussed above. In an embodiment, via 2630 is isolated from metal layer two 2706 by dielectric layer 2707. In an embodiment, as noted above, via 2630 may be circular in shape, as shown. In an alternative embodiment, via 2630 may be any shape known in the art.

FIG. 28 is a cross-sectional view of a via, generally designated 2800, in accordance with a third embodiment of the invention. In an embodiment, first power rail 2602 is a metal layer substantially similar to first power rail 1722 and/or second power rail 1728. In an embodiment, second power rail 2610 is a metal layer substantially similar to first power rail 1722 and/or second power rail 1728. As show in FIG. 28, first power rail 2602 is on a metal layer below second power rail 2610. In an embodiment, first ILD 2603 is an interlayer dielectric that is substantially similar to first ILD 1720. In an embodiment, first ILD 2603 isolates first power rail 2602 from metal layer one 2604. In an embodiment, second ILD 2609 is an interlayer dielectric that is substantially similar to third ILD 1962. In an embodiment, second ILD 2609 isolates the second power rail 2610 from metal layer two 2706. It should be noted, a dielectric capping layer between metal layers and dielectric layers is not shown but may be found in some or all embodiments, as discussed in FIGS. 17-25.

In an embodiment, metal layer one 2604 and metal layer two 2706 are metal layers that are substantially similar to metal layer one 1852 and metal layer two 1854, respectively. As noted above, metal layer one 2604 and metal layer two 2706 form a power plane, discussed above. In an embodiment, via 2630 is a metal layer that electrically connects first power rail 2602 and second power rail 2610. In an embodiment, via 2630 is isolated from metal layer one 2604 by dielectric layer 2605 and from metal layer two 2706 by dielectric layer 2707, respectively. In an embodiment, dielectric layer 2605 is substantially similar to first inner spacer 2171 and dielectric layer 2707 is substantially similar to dielectric liner 2376 which forms a second inner spacer in FIGS. 17-25.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

The invention claimed is:

1. A semiconductor device comprising:
   a first metal layer, wherein the first metal layer comprises a first dielectric layer with a first plurality of signal tracks and a first plurality of power rails;
   a second metal layer, wherein the second metal layer comprises a second dielectric layer with a second plurality of signal tracks and a second plurality of power rails;
   a metal plane between the first metal layer and the second metal layer, wherein the metal plane comprises an alternating plurality of first metal planes and second metal planes, wherein the first metal plane comprises a first material and the second metal plane comprises of a second material, wherein the first material is different from the second material to allow for selective removal of either the first metal planes or the second metal planes;
   a third dielectric layer between the first metal layer and the metal plane;
   a fourth dielectric layer between the second metal layer and the metal plane; and
   one or more first vias connecting a first power rail of the first plurality of power rails to a second power rail of the second plurality of power rails through the third dielectric layer, the fourth dielectric layer, and the alternating plurality of first metal planes and second metal planes, and
   a plurality of dielectric spacers between the one or more first vias and the alternating plurality of first metal planes and second metal planes.

2. The semiconductor device of claim 1, further comprising:
   one or more second vias connecting a first signal track of the first plurality of signal tracks to a second signal track of the second plurality of signal tracks through the third dielectric layer, the fourth dielectric layer, and the metal plane.

3. The semiconductor device of claim 2, further comprising a second plurality of dielectric spacers between the one or more second vias and the alternating plurality of first metal planes and second metal planes.

4. The semiconductor device of claim 2, wherein at least a portion of the third dielectric layer and a portion of the fourth dielectric layer are between the one or more second vias and the metal plane.

5. The semiconductor device of claim 1, wherein at least a portion of the third dielectric layer and a portion of the fourth dielectric layer are between the one or more first vias and the metal plane.

6. The semiconductor device of claim 1, further comprising a dielectric capping layer between the third dielectric layer and the first metal layer.

7. A semiconductor device comprising:

a metal plane above a first metal level, wherein the metal plane comprises two or more metal layers;

a second metal level above the metal plane; and a via connecting the first metal level to the second metal level through the metal plane, wherein a thickness of each metal layer of the two or more metal layers is smaller than a critical dimension of the via.

8. The semiconductor device of claim 7, wherein the first metal level and the second metal level include interconnect wiring.

9. The semiconductor device of claim 7, wherein there is an inner spacer between each metal layer of the two or more metal layers and the via.

10. The semiconductor device of claim 7, wherein there is a dielectric layer between the via and the metal plane.

11. The semiconductor device of claim 7, wherein the second metal level above the metal plane and the first metal level each include a plurality of signal tracks.

12. The semiconductor device of claim 11, wherein an area of the metal plane covers an area of each signal track of the plurality of signal tracks.

* * * * *